(12) United States Patent
Ninomiya et al.

(10) Patent No.: US 6,578,100 B1
(45) Date of Patent: *Jun. 10, 2003

(54) STORAGE SYSTEM HAVING PLURAL BUSES

(75) Inventors: Tatuya Ninomiya, Odawara (JP); Hidefumi Masuzaki, Hadano (JP); Hiroyuki Kurosawa, Hiratsuka (JP); Naoya Takahashi, Yokohama (JP); Yasuo Inoue, Odawara (JP); Hidehiko Iwasaki, Hiratsuka (JP); Masayuki Hoshino, Odawara (JP); Soichi Isono, Chigasaki (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/440,285

(22) Filed: Nov. 15, 1999

Related U.S. Application Data

(63) Continuation of application No. 09/013,039, filed on Jan. 26, 1998, now Pat. No. 6,012,119, which is a continuation of application No. 08/819,625, filed on Mar. 17, 1997, now Pat. No. 5,819,054, which is a continuation of application No. 08/267,013, filed on Jun. 21, 1994, now abandoned.

(30) Foreign Application Priority Data

Jun. 30, 1993 (JP) ............................................. 5-162021

(51) Int. Cl.⁷ ............................................. G06F 13/14
(52) U.S. Cl. ..................... 710/305; 710/107; 714/43; 714/47
(58) Field of Search ................................ 710/128–129, 710/119, 107, 110, 305; 714/43, 47, 56

(56) References Cited

U.S. PATENT DOCUMENTS

| 4,158,235 A | 6/1979 | Call et al. .................. 395/250 |
| 4,300,194 A | 11/1981 | Bradley et al. ............. 710/128 |

(List continued on next page.)

FOREIGN PATENT DOCUMENTS

| EP | 5206939 | 12/1990 |
| EP | 0445479 | 9/1991 |

(List continued on next page.)

OTHER PUBLICATIONS

M. Adams, et al "Database Computer Based on a Multi–microprocessor System, Final Report", NTIS, Dec. 1986, pp. 11–13.

(List continued on next page.)

*Primary Examiner*—John F. Niebling
*Assistant Examiner*—Stacy A Whitmore
(74) *Attorney, Agent, or Firm*—Antonelli, Terry, Stout & Kraus, LLP

(57) ABSTRACT

A storage system to be connected to a large-scale computer includes a plurality of first logical units connected to a host device, a plurality of second logical units connected to a storage device, a plurality of cache memories, and a common bus wired between these logical units and memories. The plurality of first logical units, the plurality of second logical units, and the plurality of cache memories are all made in the form of modules. The modules are detachably mounted to the common bus disposed on a back plane. The storage device can be made up of a plurality of small-size storage units arranged in an array. Thus, the storage system realizes its scalability. Since the plurality of first logical units, the plurality of second logical units, and the plurality of cache memories are duplexed and the common bus is made in the form of 2 channels, the storage system can perform degrade operation. Since plurality of first logical units, the plurality of second logical units, and the plurality of cache memories allow hot replace, the storage system can realize its non-stop maintenance.

31 Claims, 17 Drawing Sheets

U.S. PATENT DOCUMENTS

| | | | |
|---|---|---|---|
| 4,417,334 A | 11/1983 | Gunderson et al. ............ 370/85 |
| 4,453,215 A | 6/1984 | Reid | |
| 4,486,826 A | 12/1984 | Wolff et al. | |
| 4,490,785 A | 12/1984 | Strecker et al. | |
| 4,636,946 A | 1/1987 | Hartung et al. | |
| 4,695,952 A | 9/1987 | Howland | |
| 4,754,397 A | 6/1988 | Varaiya et al. | |
| 4,785,453 A | 11/1988 | Chandran et al. | |
| 5,037,310 A | 8/1991 | Marinello .................... 439/61 |
| 5,089,958 A | 2/1992 | Horton et al. ......... 395/182.03 |
| 5,093,826 A | 3/1992 | Leichum | |
| 5,123,099 A | 6/1992 | Shibata et al. .............. 395/447 |
| 5,148,432 A | 9/1992 | Gordon et al. ......... 395/182.05 |
| 5,155,835 A | 10/1992 | Belsan ....................... 395/441 |
| 5,206,939 A | 4/1993 | Yanai et al. | |
| 5,224,213 A | 6/1993 | Dieffenderfer et al. ..... 395/250 |
| 5,237,567 A | 8/1993 | Nay et al. .................. 370/85.1 |
| 5,247,618 A | 9/1993 | Davis et al. ................ 395/841 |
| 5,283,879 A * | 2/1994 | Carteau et al. ................. 710/1 |
| 5,335,352 A | 8/1994 | Yanai et al. ................ 395/800 |
| 5,337,414 A * | 8/1994 | Hashemi et al. .............. 710/52 |
| 5,345,566 A | 9/1994 | Tanji et al. .................. 395/325 |
| 5,388,215 A | 2/1995 | Baker et al. ........... 395/200.01 |
| 5,430,855 A * | 7/1995 | Walsh et al. .................. 710/10 |
| 5,459,856 A * | 10/1995 | Inoue ........................ 711/113 |
| 5,471,586 A | 11/1995 | Sefidvash | |
| 5,495,585 A | 2/1996 | Datwyler et al. ........... 395/280 |
| 5,625,777 A * | 4/1997 | Takahashi et al. .......... 710/103 |
| 5,630,056 A | 5/1997 | Horvath et al. ............. 395/308 |
| 5,708,784 A * | 1/1998 | Yanai et al. ................. 710/119 |
| 6,012,019 A * | 1/2000 | Saby ........................... 702/32 |

FOREIGN PATENT DOCUMENTS

| | | |
|---|---|---|
| JP | 6143742 | 9/1986 |
| JP | 2234254 | 9/1990 |
| JP | 331919 | 2/1991 |
| JP | 3192425 | 8/1991 |
| JP | 3245246 | 10/1991 |
| JP | 460846 | 2/1992 |
| JP | 496818 | 3/1992 |
| JP | 4155466 | 5/1992 |
| JP | 4157549 | 5/1992 |
| JP | 4223518 | 8/1992 |
| JP | 4264910 | 9/1992 |
| JP | 4284523 | 10/1992 |
| JP | 553936 | 3/1993 |
| JP | 5134945 | 6/1993 |

OTHER PUBLICATIONS

"Using Dual and Mappable Spare Bus" IBM Technical Disclosure Bulletin, vol. 37, Pub. No. 2B, Feb. 1994, pp 59–64.

\* cited by examiner

FIG. 5A
FIG. 5B
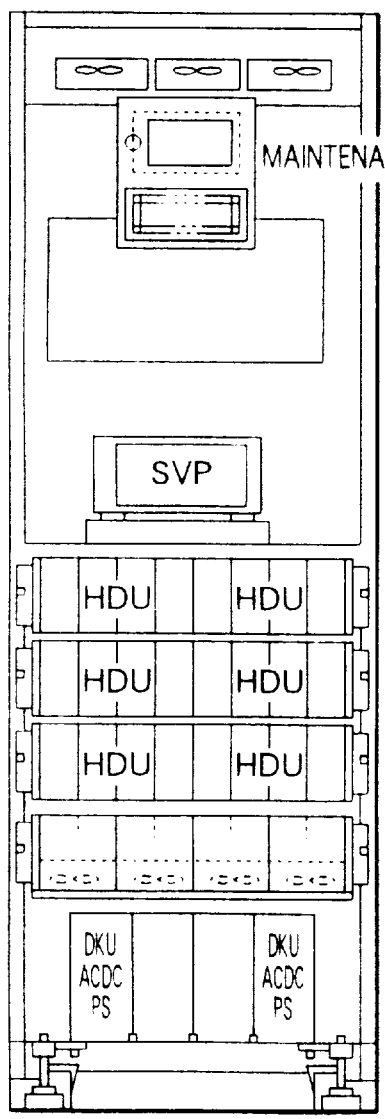
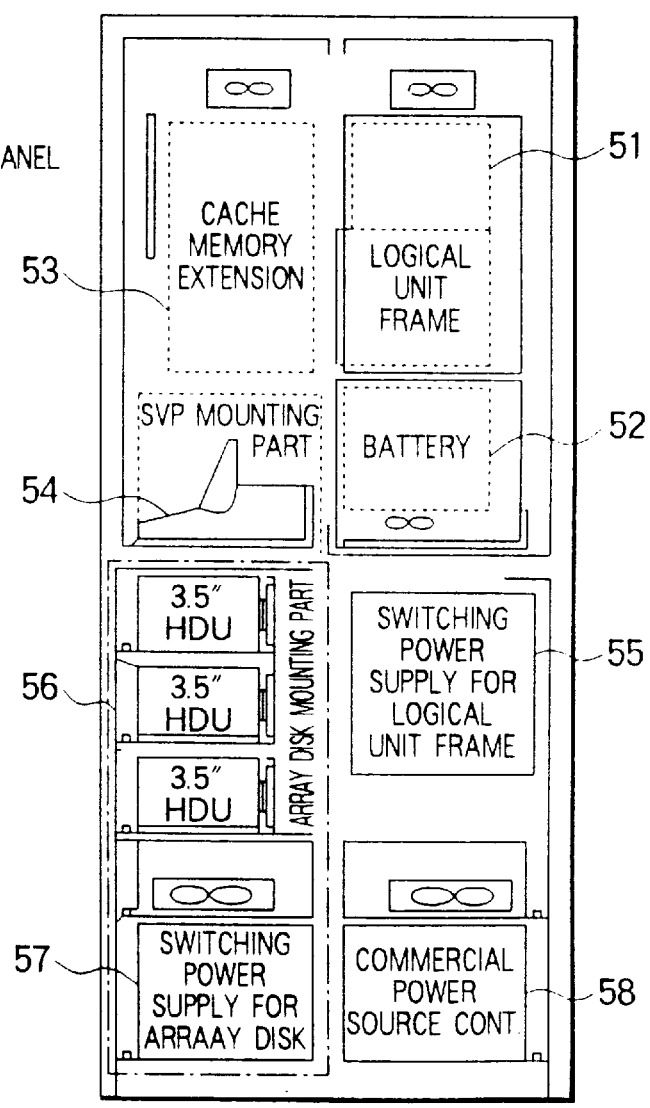

| ITEM NUMBER | SINGLE MAGNETIC DISK CAPACITY | ARRAY CONFIGURATION | ARRAY CAPACITY |
|---|---|---|---|
| 141 | 3.0 GB (3.5 INCH) | (14D+2)×5 | APPROX 220GB |
| 142 | 4.0 GB (5 INCH) | (14D+2)×4 | |
| 143 | 8.4 GB (6.4 INCH) | (14D+2)×2 | |

STORAGE SYSTEM HAVING PLURAL BUSES

This is a continuation of application Ser. No. 09/013,039, filed Jan. 26, 1998 now U.S. Pat. No. 6,012,119; which is a continuation of Ser. No. 08/819,625, filed Mar. 17, 1997, now U.S. Pat. No. 5,819,054; which is a continuation of Ser. No. 08/267,013, filed Jun. 21, 1994, now abandoned.

BACKGROUND OF THE INVENTION

1. Field of the Invention

The present invention relates to storage systems which include a storage controller for controlling such a storage device as a magnetic device a magnetic tape device, a semiconductor storage device or an optical disk device connected to a large-scale computer, a network system or the like, and more particularly, to a storage system which is highly extendable and which allows degraded operationand hot replace.

2. Description of the Related Art

As a conventional storage system connected to a large-scale computer, there has been known such a storage system as disclosed in, e.g., JP-B-61-43742 (corresponding to U.S. Pat. No. 4,636,946), wherein interfaces (host adaptors) with an higher-rank or host device (computer) (CPU), a cache memory, and interfaces (disk adaptors) with a storage device such as a magnetic disk device are interconnected by hot lines (dedicated lines).

FIG. 20 shows a schematic arrangement of a conventional storage system. In the drawing, reference numerals 201-1 to 201-n denote host adaptors connected to a plurality of host computers (CPUs) (logical modules connected to a host computer), 202-1 to 2-2-n denote disk adaptors (logical modules connected to a storage device) connected to a shared large-scale disk device 205, 203 denotes a cache memory shared with the plurality of host adaptors, and 206 denotes a shared management memory shared therewith. In a conventional storage system, hot lines 207-1 to 207-n and 208-1 to 208-n are connected between the host adaptors 201-1 to 201-n and cache memory 203, between the cache memory 203 and disk adaptors 202-1 to 202-n, between the host adaptors 201-1 to 201-n and management memory 206 and between the management memory 206 and disk adaptors 202-1 to 202-n respectively. Further, maintenance processors (SVPs, not shown), which carry out monitoring and maintaining operation over these host adaptors and disk adaptors, are connected to the respective host and disk adaptors through respective dedicated lines.

In the above related technology, since the hot lines are wired between the host adaptors (logical modules connected to the host device) to the host device, the disk adaptors (logical modules connected to the storage device) to the storage device, and the cache memory (cache memory module), the system configuration becomes more complicated, the host adaptors, cache memory, disk adaptors and disk device are poorer in extendability, which leads to impossibility of realization of a so-called scalable (extendable and reducible) system configuration. Further, in the related art system, no consideration is paid to the fact that multiplexing of the system enables degraded operation(one of the system multiplexers is stopped and the other alone is operated) at the time of failure occurrence or Hot replace (a substrate or a circuit part is inserted for its exchange while the system is being operated). For this reason, the related art system has had a problem that, when it is desired to perform part exchange at the time of failure occurrence or to grade up a system control program, the system must be temporarily stopped for that purpose.

SUMMARY OF THE INVENTION

Therefore, it is an object of the present invention to provide a storage system which solves the above problem in the related art and which employs a common bus system in such a manner that such logical modules as host adaptors and memory adaptors, a cache memory and a storage medium can be connected according to the system configuration (scale or size) to realize a scalable system. Further, an object of the present invention is to provide a storage system which can realize degraded operation by multiplexing respective logical modules, a storage medium and a common bus and also which can realize hot replace of the respective logical modules and storage medium to thereby allow system maintenance without halt of the system.

In accordance with an aspect of the present invention, there is provided a storage system which comprises a plurality of logical units connected to a host device to form interfaces with the host device, a storage unit, a plurality of logical units connected to the storage unit to form interfaces with the storage unit, and cache memories (shared with the plurality of logical units connected to the host device and with the plurality of logical units connected to the storage unit) for temporarily storing therein data to be transferred between these devices and units, and wherein the plurality of logical units connected to the host device the plurality of logical units connected to the storage unit, and the cache memories are interconnected by a common bus shared with these devices and units. As a result, there can be obtained a scalable system which realizes extension and modification of the plurality of logical units connected to the host device, the plurality of logical units connected to the memories, and the cache memory merely adding or modifying these on the common bus, and which realizes easy attainment of its upgrade based on the extended system provision.

Since the plurality of logical units connected to the host device, the plurality of logical units connected to the memories, and the cache memories are arranged in a duplexed form and the common bus is wired between these logical units and memory as divided into 2 channels, even when one of these units becomes faulty, the other unit can be used to perform degrade operation. In this connection, information indicative of the degraded operation status at the time of the failure occurrence is written in the shared memory.

In this case, since any of the plurality of logical units connected to the host device, the plurality of logical units connected to the storage unit, and the cache memories are provided with a connector allowing hot replace, the system allows its maintenance and inspection for exchange of a faulty part and also allows addition of parts for system extension while eliminating the need for halt of the system in operation.

BRIEF DESCRIPTION OF THE DRAWINGS

FIG. 5A is a front view of a control unit in the system of the embodiment of the present invention, showing an example of how the control unit is mounted;

FIG. 5B is a side view of the control unit in the system of the embodiment of the present invention;

DESCRIPTION OF THE PREFERRED EMBODIMENTS

An embodiment of the present invention will be explained with reference to FIGS. 1 to 18.

Figure 1:
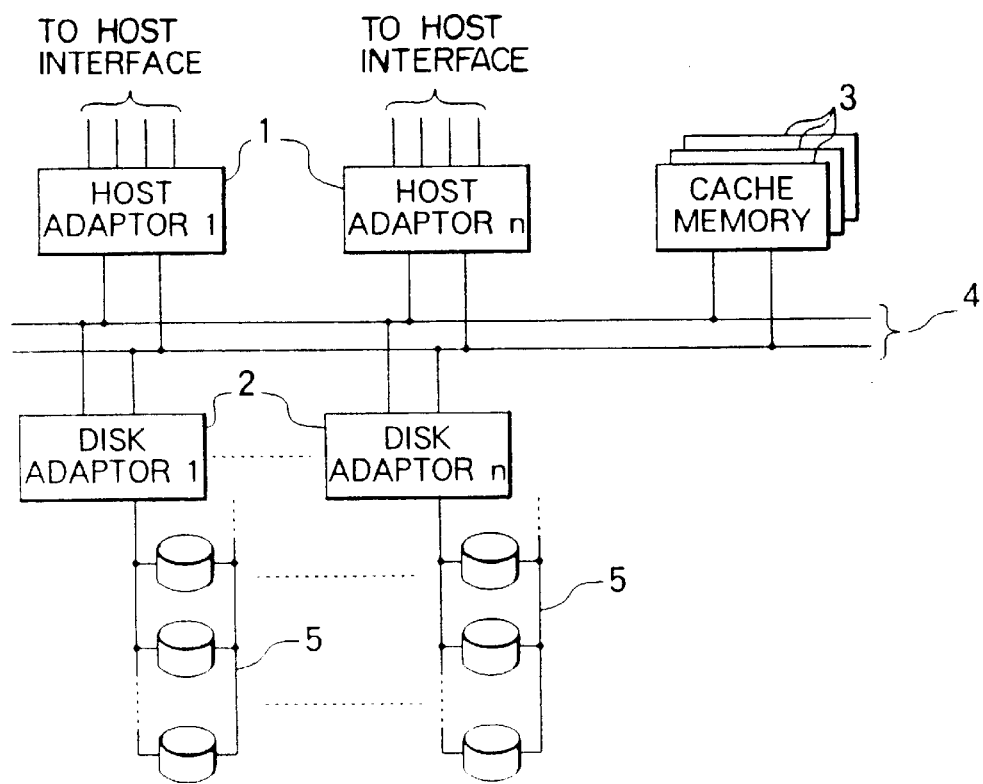
FIG. 1 conceptionally shows a schematic arrangement of a storage system in accordance with an embodiment of the present invention.

FIG. 1 shows a conceptional diagram of the present invention. The present embodiment will be briefly explained by referring to FIG. 1.

In the drawing, reference numeral 1 denotes a host adaptor as a logical module connected to a host CPU (host computer), 2 a disk adaptor as a logical module connected to a storage medium, 3 a cache memory package (cache memory modules) for temporarily storing therein data to be transferred between the both modules, 4 a common bus for controlling data transfer between the host adaptor 1, disk adaptor 2 and cache memory package 3, 5 a group of magnetic disks (which will be hereinafter referred to merely as "array disk") as a storage medium vertically and horizontally arranged in an array. The host adaptor 1 has a means for converting the data format and address format of the host interface side into data and address formats suitable for the storage medium interface and a duplexed microprocessor for performing control and management over the means. The disk adaptor 2 has an address operation function for storage of data in the storage medium, a function of creating redundant data for ensuring memory data, a function of recognizing information on the structure of the storage medium, and a duplexed microprocessor for performing control and management over these functions.

In FIG. 1, the host adaptor writes write data received from the host device (CPU) and information on the management of the write data once in the cache memory package 3 via the common bus 4, and after completing the writing operation, issues or reports the host device of the completion of the writing operation. In an idle time after that, the disk adaptor 2 reads out data from the cache memory package 3 on the basis of the management information of the cache memory package 3.

The host adaptor, when receiving a data read instruction from the host device and the corresponding data is present on the cache memory package 3, does not perform its reading operation of it from the array disk 5 but transmits the data on the cache memory package 3 to the host device. On the other hand, when the data is not present on the cache memory package 3, the disk adaptor 2 writes the data and management information thereof on the cache memory package 3 from the array disk 5 through the common bus 4. The host adaptor 1 refers to the management information, reads out data from the cache memory package, and transmits it to the host device.

The number of the host adaptors 1, the number of the disk adaptors 2 and the number of the cache memories in the cache memory package 3 on the common bus 4 can be respectively arbitrarily changed. When the mounting number of the host adaptors 1 is changed, the number of buses connected to the host devices is also changed, so that the data transmission capability to the host device can be enhanced. When the mounting number of the disk adaptors 2 is changed, the number of buses connected to the storage medium is also changed, so that the data writing/reading transmission capability to the storage medium can be enhanced. At the same time, the number of storage medium can be also increased. When the mounting number of cache memories in the cache memory package 3 is changed, the capacity of the cache memory package as a temporary data storage is also changed, so that a ratio of the capacity of the cache memory package to the total capacity of the storage medium can be increased, which results in that there can be realized a scalable system arrangement which can increase a probability (which will be referred to as "cache hit rate", hereinafter) that data accessed by the host device is present on the cache memories.

Figure 2:
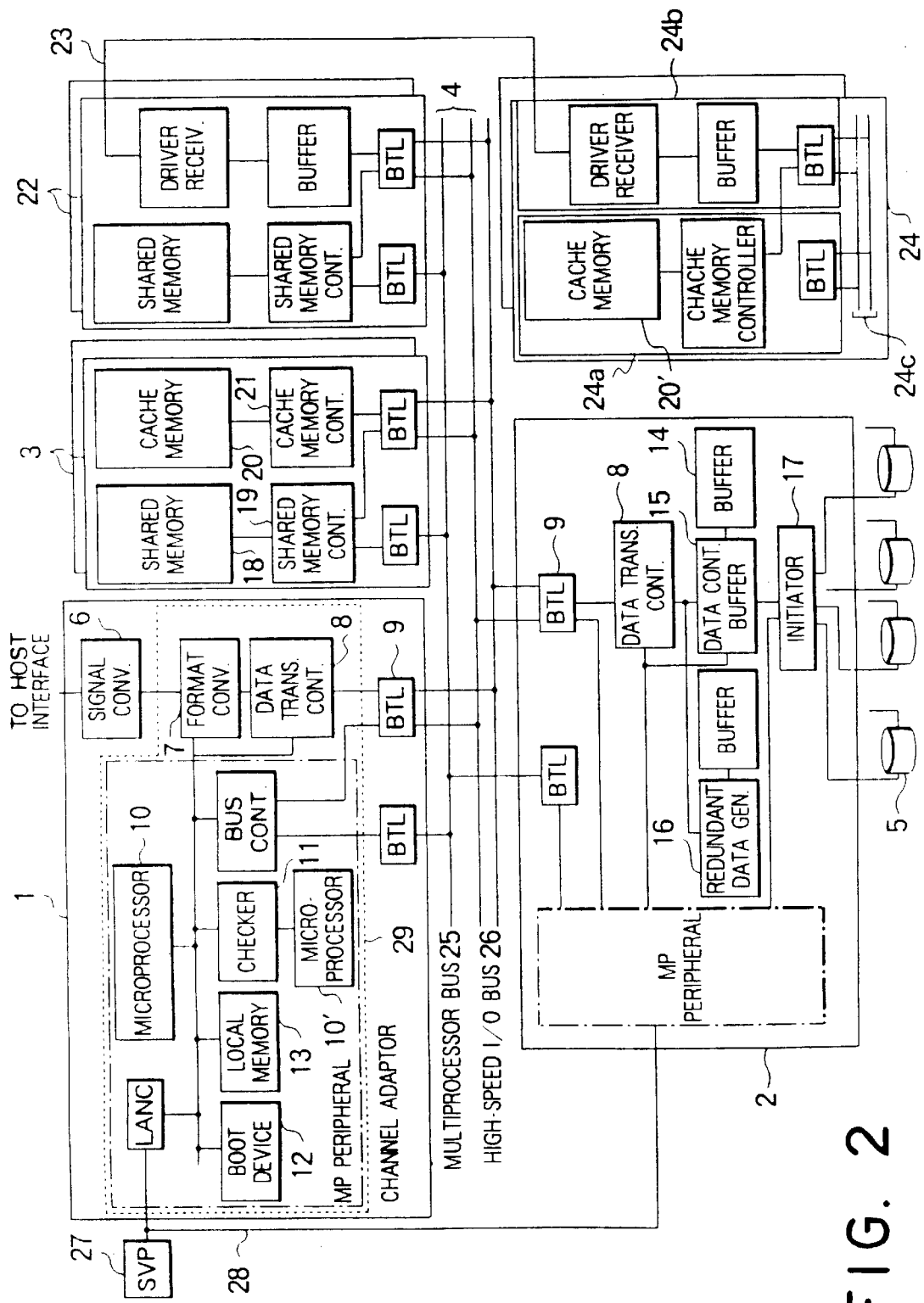
FIG. 2 is a detailed arrangement of the storage system of the embodiment of the present invention.

FIG. 2 is a detailed arrangement of the conceptional diagram of FIG. 1. In FIG. 2, only one of the plurality of host adaptors 1 and only one of the plurality of disk adaptors 2 are illustrated and the other adaptors are omitted.

The host adaptor 1 includes a signal converter 6 for converting an optical signal of the host interface into an electric signal, a format converter 7 for converting the format of data of the host device into a format suitable for the array disk 5, and a data transmission controller 8 for controlling data transfer to the common bus 4 and having a storage buffer therein for storage of a packet transmission unit of data. The host adaptor 1 also includes a bus driver 9 of a small-amplitude current drive type (which driver will be referred to as the BTL, hereinafter) allowing hot replace. Note that "BTL" is a registered trademark of National Semiconductor Ltd.

A data transmission request from the host computer is sent to a microprocessor 10 (which will be referred to merely as the MP 10, hereinafter), and data transmission control within the host adaptor 1 is put under control of the MP 10.

In order to secure a high reliability with which a failure occurrence of the MP 10 is detected, the host adaptor 1 has, in addition to the MP 10, an MP 10' similar to the MP 10. A checker 11 performs comparison between the MP 10 and MP 10'.

A boot device 12 for storing therein a program for control of the MP 10 employs a rewritable large-capacity flash memory. The MP 10 produces a copy of the control program on a local memory 13 as necessary, whereby a memory access time to the MP 10 can be made short or an access speed can be made high. A part 29 enclosed by a broken line in FIG. 2 refers to a channel adaptor module. The host adaptor 1 has such modules 29 corresponding to two circuits.

The disk adaptor 2 includes a buffer memory 14 for storing therein sector units of data to be written in the array disk 5, a data control buffer 15 for controlling the buffer memory 14 and data transmission control, a redundant data generator 16 for generating redundant data for ensuring the data to be written in the array disk 5, and an initiator (SCSI master side interface) 17 to the array disk 5 (target).

Data transmission control within the disk adaptor 2 is carried out under control of an MP peripheral (including the MP 10, MP 10', checker 11, boot device 12 and local memory 13 and having a control program for the disk adaptor 2 therein) having the same structure as the host adaptor 1.

Although only 4 disks (targets) are illustrated as the array disks 5 in FIG. 2, the array disks are actually made up of, for example, 4 (horizontal)×4 (vertical) to 4 (horizontal)×4 (vertical) of disks for the single disk adaptor 2. Each of the horizontal row forms an error correction group (ECC group) which is made up of, e.g., 3 data disks and single parity disk. Further, three are a plurality of buses between a set of such array disks 5 and the disk adaptor, which are connected to at least 2 or more of the disk adaptors 2, which will be described later. Also there are a plurality of buses between the CPU and the host adaptor 1, which are connected to at least 2 or more of the host adaptors 1. And when a failure takes place in one of the host adaptors, an access from the same CPU to the same array disk 5 can be realized through the other host adaptor 1 or the other disk adaptor 2.

The cache memory package 3 includes a shared memory 18 for storing therein various sorts of management information and accessible commonly by the MPs 10 of the adaptors, a shared memory controller 19, a cache memory 20, and a cache memory controller 21. Each of the both memory controllers 19 and 21 have or embed an ECC generation circuit for ensuring memory write data and an inspection/correction circuit for read data. The entire cache memory package 3 realizes a cache capacity of up to 1 GB, and in order to a duplexed cache memory, 2 of the cache memory packages 3 are mounted in the system.

When it is desired to further increase the capacity of the cache memories, in place of the cache memory package 3 (or in addition to the cache memory package 3), a cache port package 22 is mounted so as to be connected to a cache unit 24 through a cable 23 for interconnection between back planes (plates for substrate insertion). The cache memory unit 24 has a cache memory package 24a having cache memories 20', a cache port package 24b connected t the inter-back-plane interconnection cable 23, and a high speed I/O bus 24c connected to the cache memory package 24a and cache port package 24b for performing high-speed data transmission therethrough. The cache memories within the additionally-provided unit 24 are arranged so as to be accessed via the cache port package 22 and cable 23. The provision of the cache unit 24 enables an increased cache capacity of up to 8 GB×2. FIG. 2 shows such a case that, in addition to the provision of 2 of the cache memory packages 3, the cache port package 22 is mounted which is connected to the cache unit 24 through the cable 23.

Such host adaptors 1, disk adaptors 2 and cache memory package 3 as mentioned above are interconnected by the common bus 4 which includes a multiprocessor (which will be referred to as the M bus, hereinafter) 25 through which the MP 10 of each adaptor accesses the shared memory and a high-speed (fast) I/O bus (which will be referred to as the F bus, hereinafter) 26.

The F bus 26 is operated usually on a 64-bit-width, 2-channel, parallel basis so that, when one of the 2 channels becomes faulty, the other performs degrade operation. Further, when the M bus 25 becomes faulty, either one of the two channels of the F bus 26 is used as the M bus and the remaining other channel is used as the F bus.

Further, the element BTL 9 allowing hot replace (at the time of inserting or removing a part, the inserting or removing operation can be carried out with a small load of the inserted or removed part, for which reason the part inserting or removing operation can be done under the activated system) is used as an interface with the common bus 4. When the host adaptor 1 becomes faulty, the host adaptor is closed. That is, the system closes the corresponding faulty bus and instead uses the other normally-operating host adaptor 1 to continue the access to the array disk 5 from the host device (the same CPU). The maintenance operator removes the host adaptor 1 in which a failure occurred during the operation of the system and which is put in its closed state. Thereafter, a normal host adaptor 1 is inserted in the system and a restoration instruction is given from a maintenance processor (which will be referred to as the SVP, hereinafter) 27 to a LAN 28, so that the system checks the operation of the exchanged host adaptor 1 in such a manner that, if the host adaptor is normal, the system restores the closed bus to realize non-stop operation. In the drawing, reference symbol LANC denotes refers to LAN Controller (SVP interface controller). The SVP 27 is similarly connected also to the other host adaptor 1 and the disk adaptor 2 for monitoring and maintenance.

When the control program of each adaptor is required to be modified, the SVP 27 rewrites the contents of the control program within the boot device 12 through the LAN 28 to enable non-stop upgrade.

That is, when it is desired to upgrade the control program of the system, the control program within the boot device 12 of the host adaptor 1 and disk adaptor 2 for the program upgrade is first rewritten. After the rewriting of the control program is completed, the adaptor having the rewritten control program is reset to perform exchange of the system control program.

Figure 3:
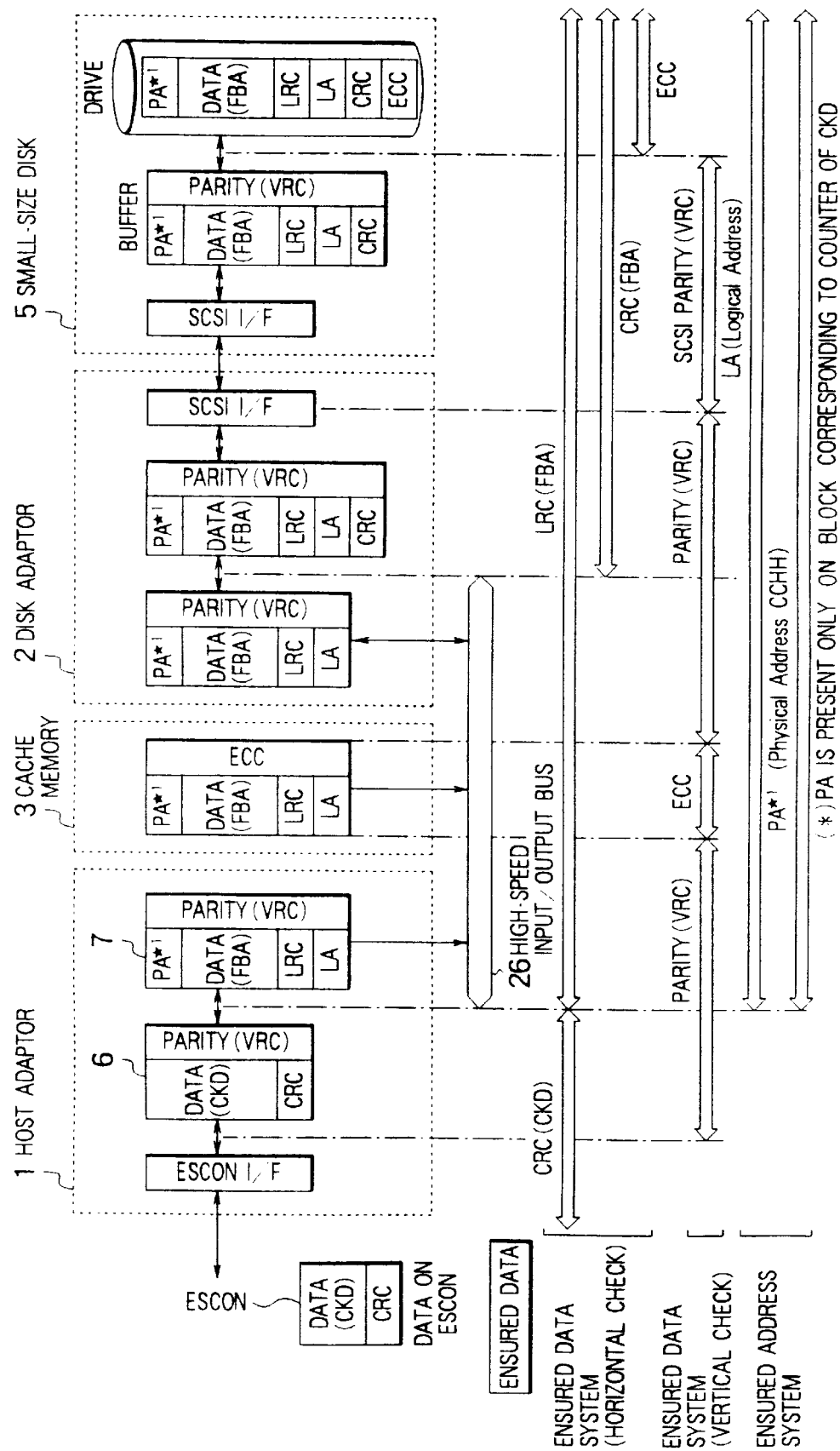
FIG. 3 is a diagram for explaining data flow and data format in the arrangement of FIG. 2.

FIG. 3 is a diagram for explaining data flow and ensured data in the arrangement of FIG. 2.

When data is written in the array disk 5 from the host device, information on a physical address (which will be referred to merely as PA, hereinafter) in a memory space as a write destination and then data (CKD (count key data) format) plus a CRC (cyclic redundancy check) code are sent from, e.g., ESCON (trade name of IBM ltd.). These optical signals are converted at the signal converter 6 into electric signals and parity is also generated. The format converter 7 converts a data format into an FBA (fixed blocked architecture) format and attaches an LRC (longitudinal redundancy check) code thereto, takes the PA as part of the data to generate a logical address (which will be referred to as LA, hereinafter), attaches parities to all these information, and then sends it onto the F bus 26.

The cache package 3 attaches an error correctable ECC to the data received from the F bus 26 and writes it in the cache memory 20.

The disk adaptor 2 further attaches the data received from the F bus to a CRC code and sends the code-attached data to the array disk 5 via the SCSI interface to attach the ECC to each of the magnetic disk units and to ensure write data.

Even upon reading data from the array disk 5, the read data is similarly inspected and corrected on the basis of each check code to improve its reliability.

As has been explained above, the check code is duplexed, that is, horizontal check for every predetermined length is carried out in the data length direction while vertical check (for example, for every bite unit) is carried out in the data vertical (width) direction, so that one of the double check codes is reliably transferred as data between transfer regions (enclosed by a chain-dotted line in the drawing) to compare the check code transferred as the data with a check code created from the transferred data, whereby the data is positively ensured.

Figure 4:
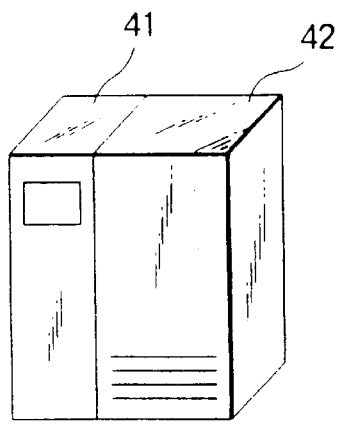
FIG. 4 is an appearance view of the embodiment of the present invention.

Shown in FIG. 4 is an appearance view of an apparatus for implementing the scalability explained in connection with FIG. 1, which comprises two units, i.e., a control unit 41 for controlling the array disk 5 and an array unit for mounting the array disk 5 therein.

FIGS. 5A and 5B show mounting diagrams of the control unit 41, wherein FIG. 5A is a front view thereof and FIG. 5B is a side view thereof respectively. In FIG. 5B, reference numeral denotes a logical unit frame part for mounting therein the host adaptors 1, disk adaptors 2 and cache memory package 3, 52 a battery part for supplying power to the cache memory as a volatile memory in case of power failure, 53 a cache memory extension part for mounting therein the cache unit 24 and an additional battery for the added memory at the time of adding a cache memory, 54 an SVP mounting part, 55 a switching power supply of the logical unit frame for supplying power to the logical unit part, 56 an array disk mounting part when the configuration (capacity) of the array disk 5 is small, 57 an array disk switching power supply for supplying power to the array disk 5, 58 a commercial power supply controller for supplying power to both the switching power supplies 55 and 57.

Figures 6A, 6B:
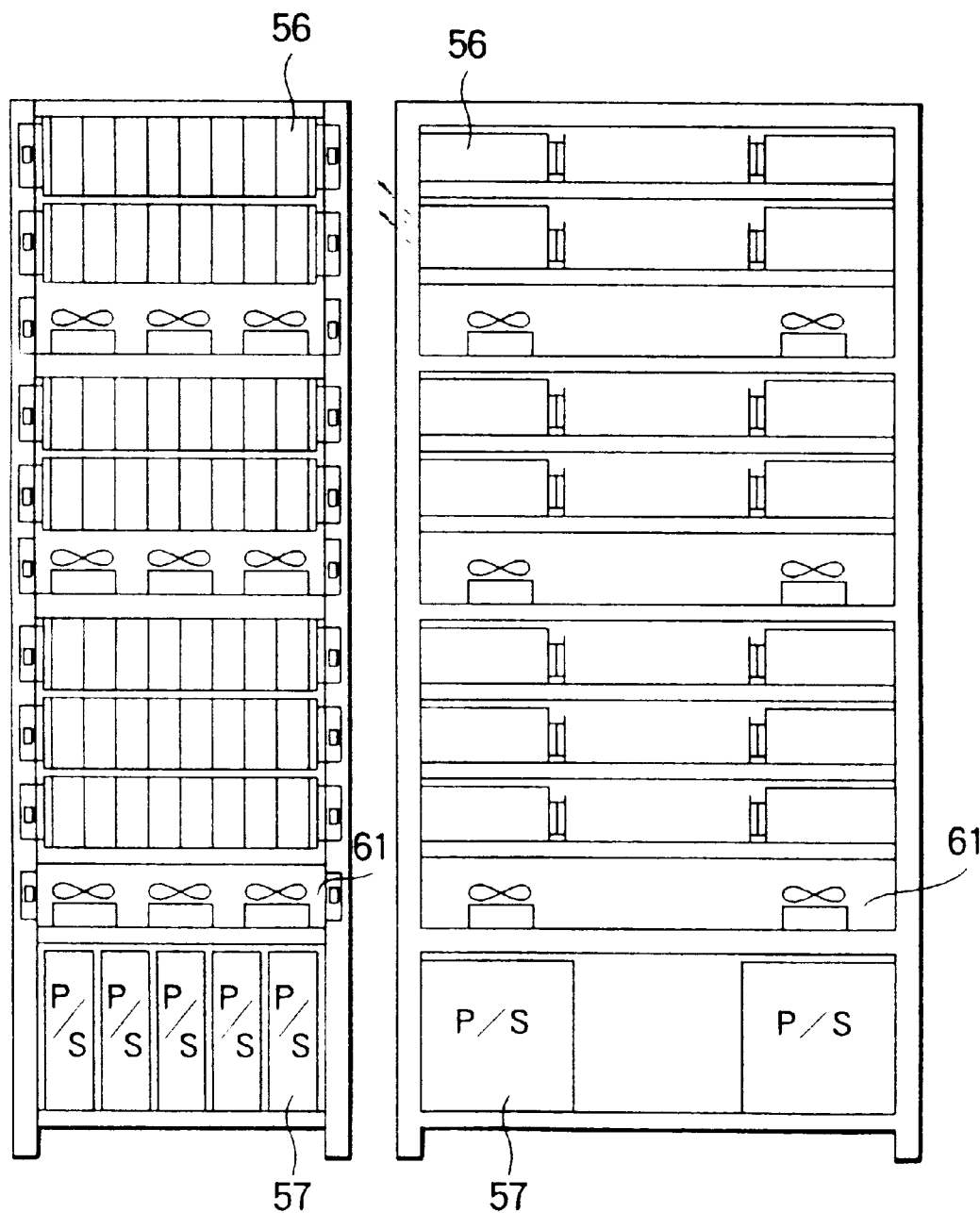
FIG. 6A is a front view of an array disk unit in the system of the embodiment of the present invention, showing an example of how the control unit is mounted.
FIG. 6B is a side view of the array disk unit in the system of the embodiment of the present invention.

FIGS. 6A and 6B show mounting views of the array unit 41 when it is desired to arrange a large-capacity array disk, wherein FIG. 6A is a front view thereof and FIG. 6B is a side view thereof.

The array disk mounting part 56 can mount therein up to 112 (8(row)×7(column)×2) of magnetic disk units, and for easy exchange of a faulty magnetic disk unit, the mounting part 56 employs such a mounting system that the faulty and new units can be removed and inserted from the front side of the unit and from the rear side.

In FIG. 6B, reference numeral 61 denotes a cooling fan for escaping heat generated in the entire unit. In order to enhance the cooling effect and from the viewpoint of suppressing noise, the fan 61 comprises a plurality of small cooling fans located as distributed therein which move air from its floor side to the ceiling side for ventilation cooling.

Figure 7:
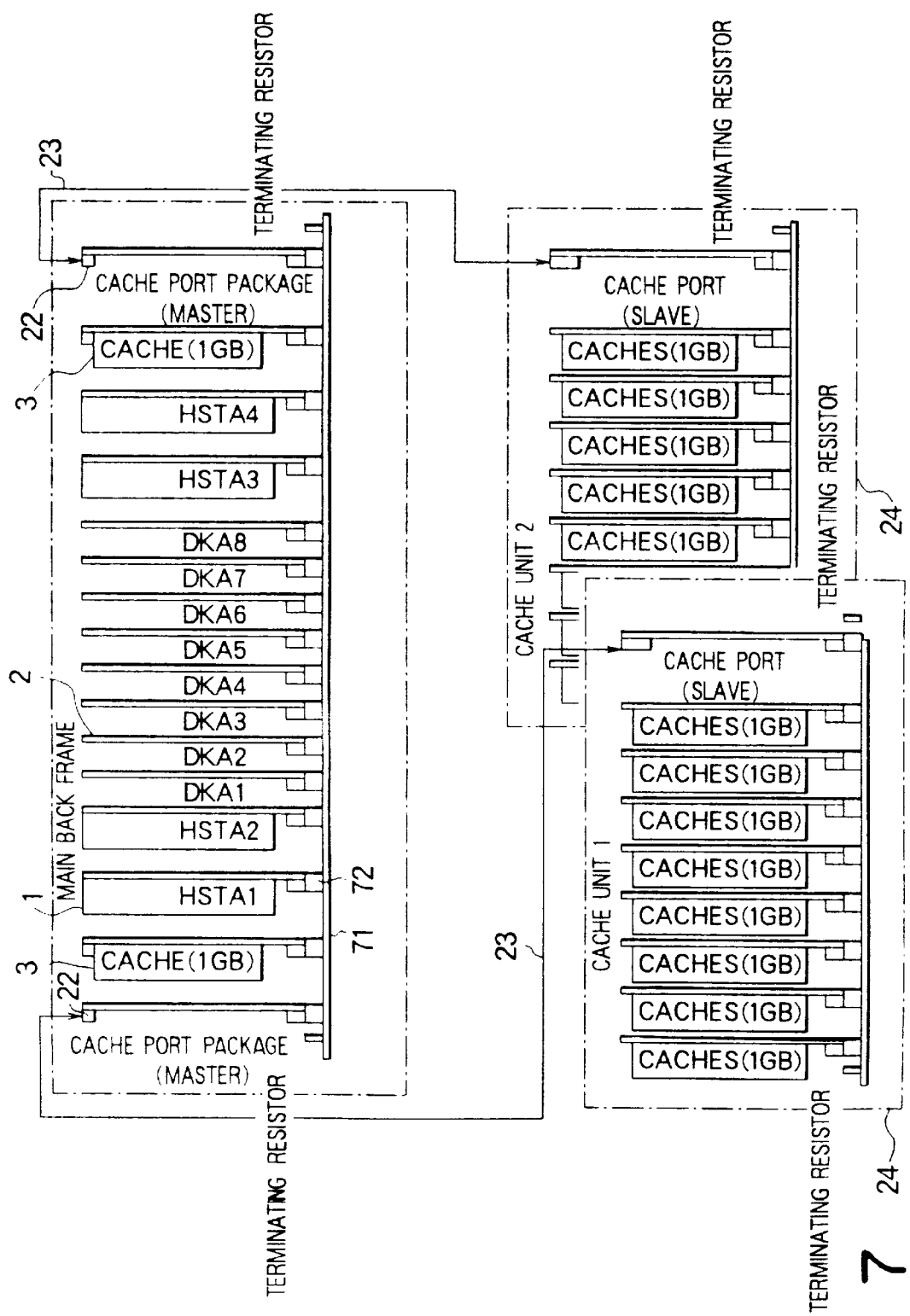
FIG. 7 is a wiring diagram of a logical unit frame part in the system of the embodiment of the present invention.

FIG. 7 is a wiring diagram of the logical unit frame part explained in FIGS. 5A and 5B.

In the drawing, reference numeral 71 denotes a back plane (plate for substrate insertion) having the common bus 4 wired in the form of a printed circuit thereon, 72 a connector for interconnection between the each adaptor, package and back plane 71.

Since data transfer between the host adaptors 1, disk adaptors 2 and cache memory package 3 is carried out through the common bus 4, each adaptor and package can be connected at any position on the connector 72 and the number of the mounting host adaptors 1 and the number of the mounting disk adaptors 2 can be freely changed.

Meanwhile, when it is desired to increase the cache capacity, the cache memory package 3 is replaced by the cache port package 22 or the cache port package 22 is mounted in addition to the cache memory package 3 and is connected to the cache unit 24 via the connection cable 23 as shown in FIG. 7. As a result, the cache memory capacity can be increased by an amount corresponding to up to 8 GB×2 in addition to the 2 GB capacity of the cache memory package 3.

Figure 8:
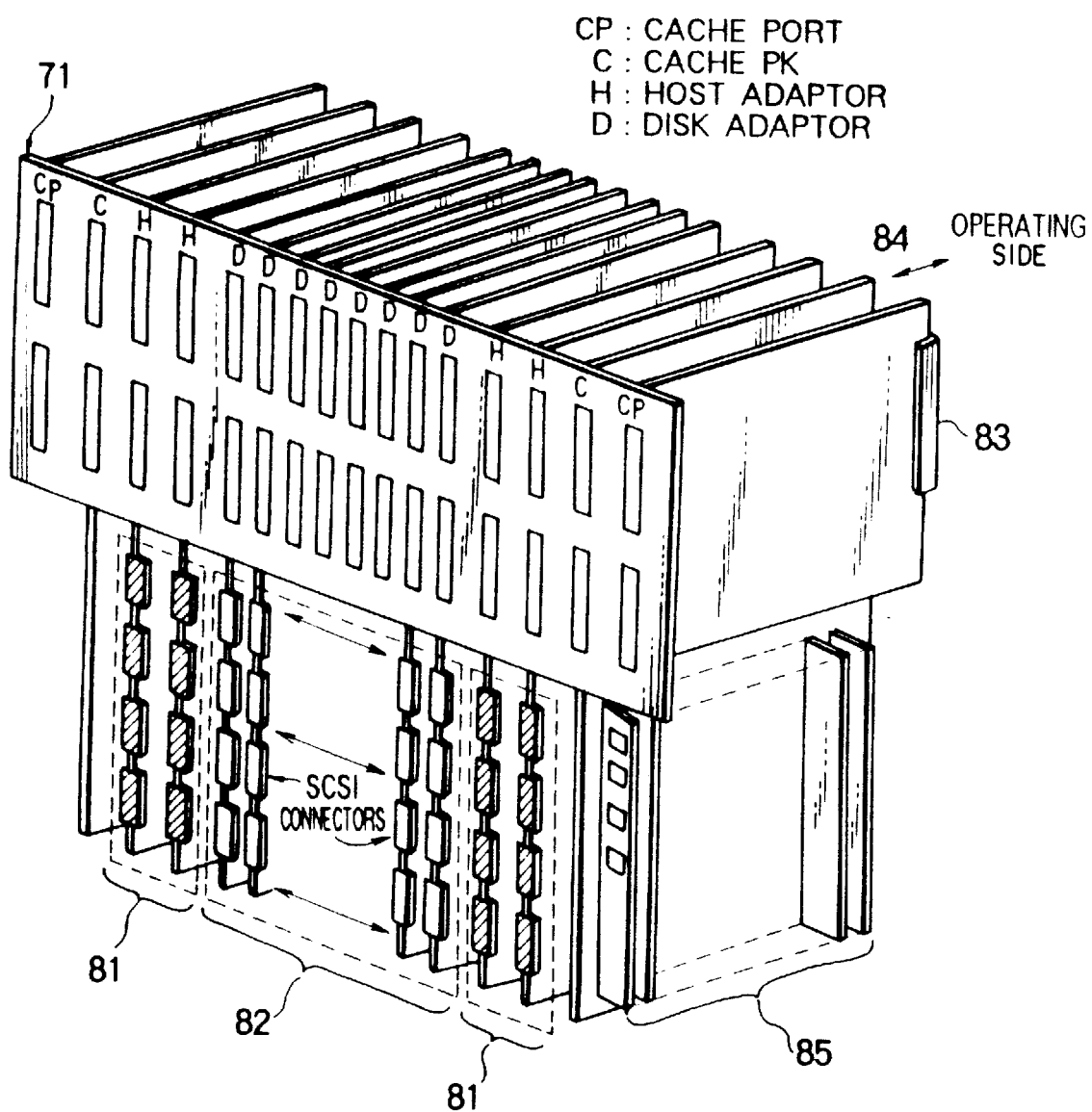
FIG. 8 is an exploded perspective view of the logical unit frame part in the system of the embodiment of the present invention, showing how the logical unit frame part is mounted.

FIG. 8 is an exploded perspective view of the logical unit frame part shown in FIGS. 5A and 5B for explaining how the frame unit is wired.

In FIG. 8, the common bus 4 is wired on a back plane 71 in its horizontal direction in the form of a printed circuit, the mounting parts of the substrates (CP) of the cache port packages 22, the mounting parts of substrates (C) of the cache memory packages 3, the mounting parts of substrates (H) of the host adaptor modules 1 and the mounting parts of substrates (D) of the disk adaptor modules 2 are provided to the back plane 71, so that each substrate can be attached to and detached from its insertion/removal operating side as shown by an arrow 84 and when each substrate is inserted in the back plane 71, the substrate is electrically connected to the common bus 4.

Reference numeral 81 denotes an optical connector part mounted in lower parts of the substrates of the host adaptors 1 to form an interface with the host device, 82 an SCSI connector part mounted in lower parts of the substrates of the disk adaptors 2 and connected to the array disk 5, 83 a connector for connection with the cable 23 between the back planes when the cache port package 22 is mounted. Numeral 85 denotes a cache memory body (the cache memory 20 in FIG. 2) mounted in the lower part of the substrate (C) of the cache memory package 3.

In order to improve operability upon removal of the faulty adaptor or package and upon insertion of a new one at the time of a failure occurrence, the connectors except for the connector 83 are not mounted to the operating side 84 but concentratedly mounted on the side of the back plane 71.

Figure 9:
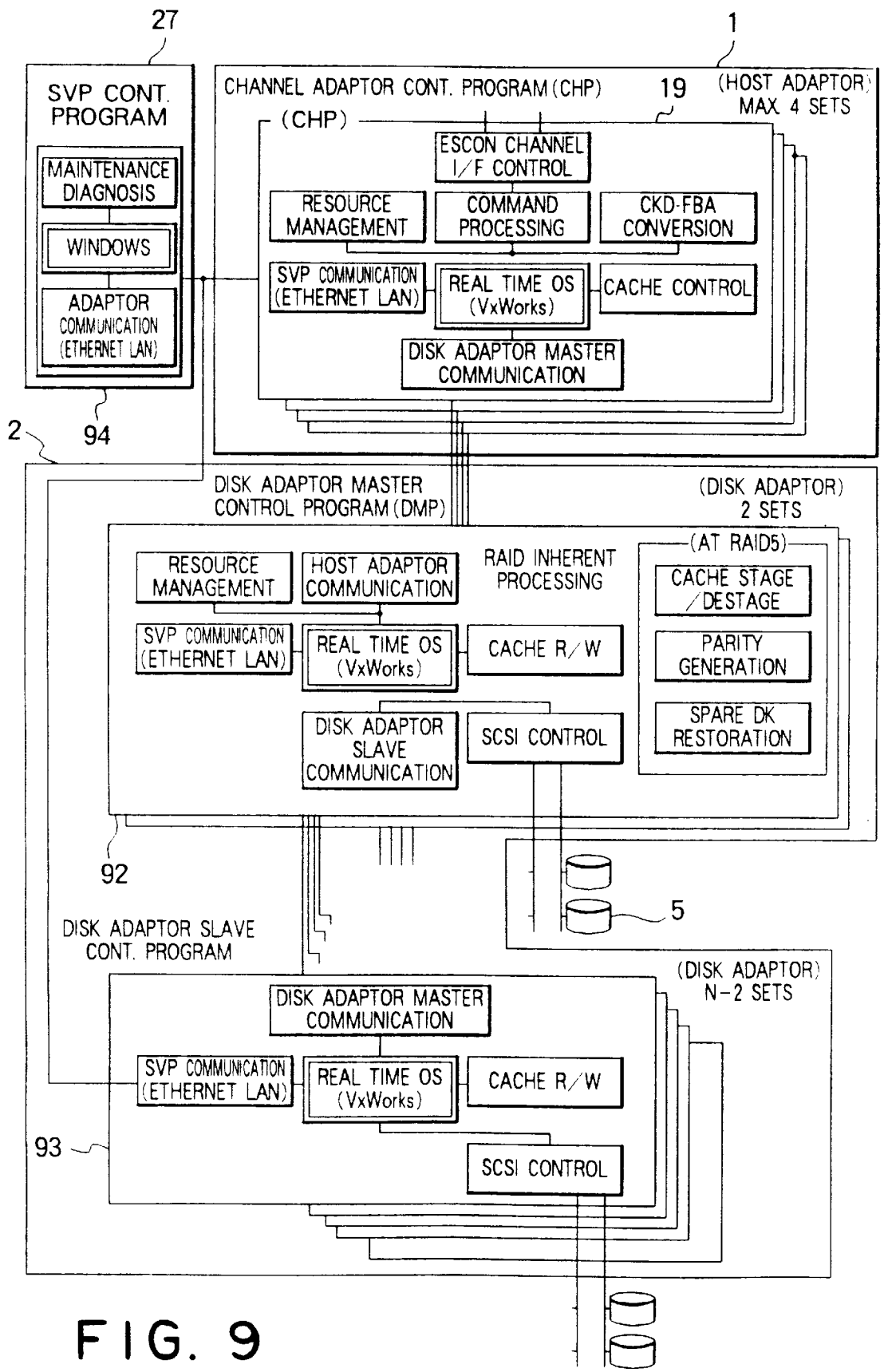
FIG. 9 is a configuration of software applied to the embodiment of the present invention.

FIG. 9 shows a configuration of software used in the present invention.

Reference numeral 91 represents a channel adaptor control program (which will be referred to as the CHP, hereinafter) written in the boot device 12 of the host adaptor 1. Of disk adaptor control programs written in the boot device 12 of the disk adaptor 2, numeral 92 denotes a disk adaptor master control program (which will be referred to as the DMP, hereinafter) for controlling the operation inherent in the array disk and data transfer between the cache memory 20 and the array disk 5, 93 denotes a disk adaptor slave control program (which will be referred to as the DSP, hereinafter) for controlling data transfer between the cache memory 20 and the array disk 5 under control of the DMP 92.

Written in the boot device 12 of the disk adaptor 2 are programs DMP 92 and DSP 93 having two sorts of functions so that, when 'n' access the array disk, one of the disk adaptors is operated as the DMP 92, another is specified as a spare for the DMP 92 (which adaptor is operated as the DSP 93), and the remaining (n−2) disk adaptors are operated as the DSPs 93.

Reference numeral 94 denotes an SVP control program for the SVP 27 for monitoring and maintaining the CHP 91, DMP 92 and DSP 93. When it is desired to renew each control program, the SVP 27 can directly renew the control program of the MP 10 stored in the boot device 12 of the adaptor to be updated or from another MP 10.

Figure 10:
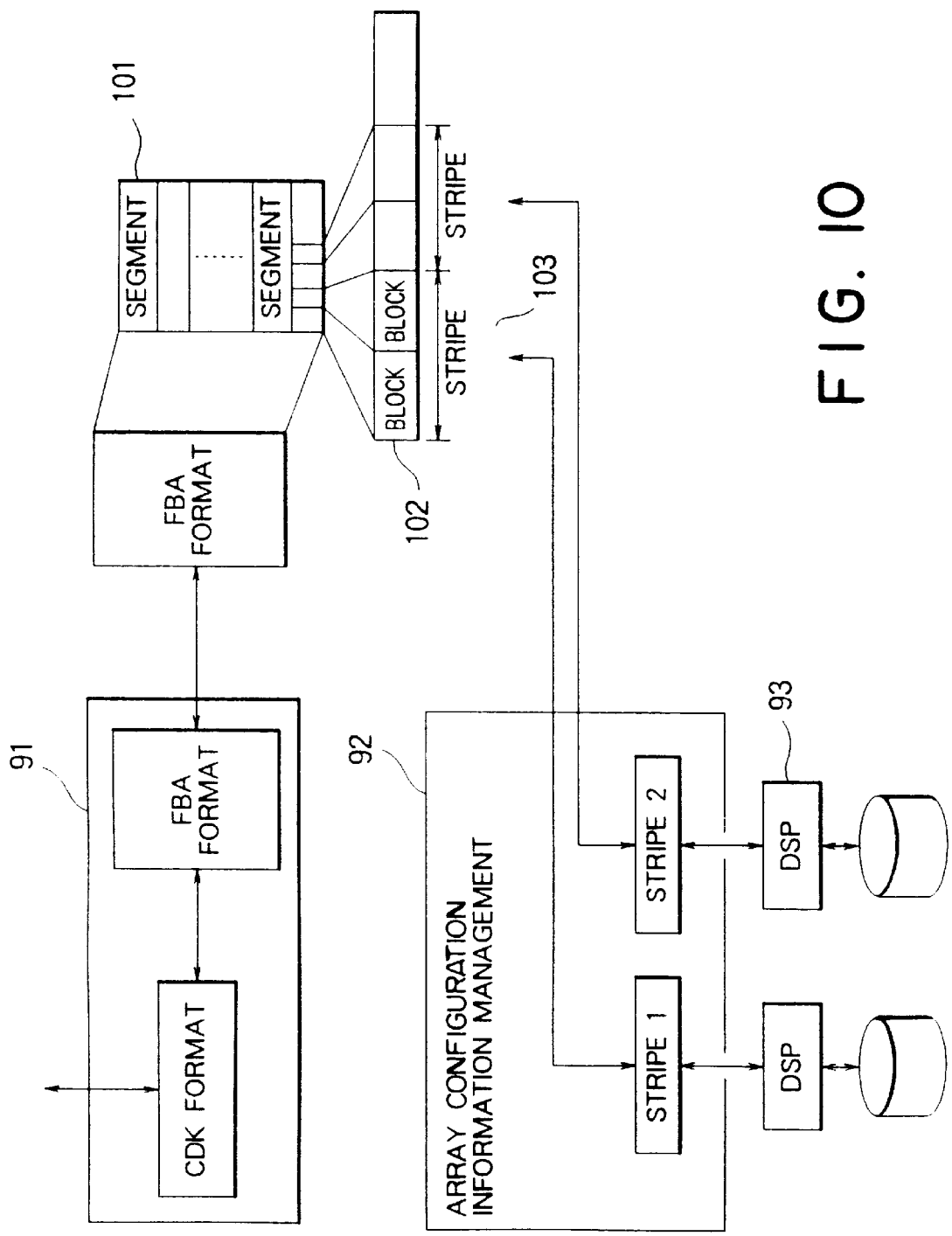
FIG. 10 is a diagram for explaining data flows and shared software functions in the embodiment of the present invention.

FIG. 10 shows shared functions of the software configuration of FIG. 9 based on the data flow.

The CHP 91 converts the address and data formats of the higher-rank or host device into address and data formats of the lower-rank device and writes them in the cache memory 20. Reference numeral 101 refers to a segment, 102 a block, 103 a stripe indicative of a data amount per magnetic disk written in the array disk 5. The DMP 92 reads out a stripe unit of data from the cache memory, converts a lower order address of the data into row No. column No, FBA and block number of the array disk, while the DSP 93 writes the data in the array disk.

The DMP 92 also manages information as to configuration of the array disk 5.

Since the respective control programs share with the respective functions as has been described above, when it is desired to change the host interface to an SCSI or fiber channel, this can be realized only by changing the control program CHP 91. Further, when it is desired to change the array disk configuration (disk row number/column number, RAID (redundant array inexpensive disk) system, etc.), this can be realized only by changing the control program of the MP 92. When the interconnection of the host adaptors 1 and disk adaptors 2 is modified and the respective control programs are rewritten, a scalability can be realized and a burden on software development can be lightened.

Figures 11A, 11B:
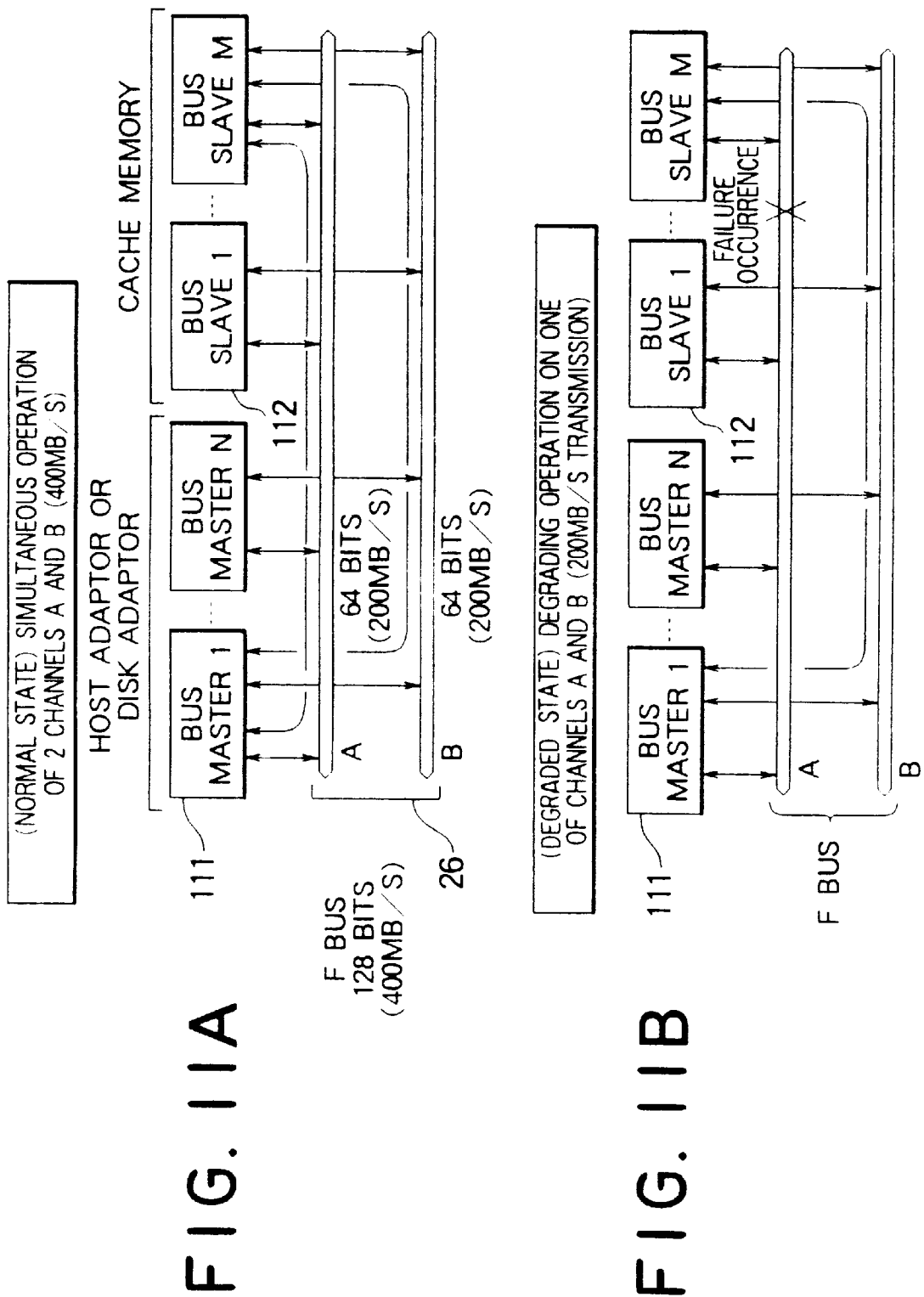
FIG. 11A is a diagram for explaining a duplex common bus in the embodiment of the present invention.
FIG. 11B is a diagram for explaining degraded operationin the embodiment of the present invention.

FIGS. 11A and 11B are diagrams for explaining the duplexed common bus 4 and degrade operation. Reference numeral 111 denotes a bus master (the host adaptor 1 or disk adaptor 2 having the MP 10) capable of acquiring an access authority to the common bus 4, and numeral 112 denotes a bus slave (cache memory package) for receiving an access request from the bus master 111.

The F bus 26, in its usual operational state, realizes a transmission rate of 400 MB/sec. based on 2 channels each 64 bit bus (200 MB/sec.), and each bus channel can detect a failure based on parity check or time-out. When a failure takes place in one of the two channels, the bus master 111 is put in its degrade state so that the remaining one channel is used to have an access to the bus slave 112 and the then degraded operation information is registered in the management area on the shared memory 18.

System control signals (including a bus reset signal) within the common bus are increased in reliability because the signal line is arranged in a triplex system so that 3-line (channel) coincidence system is employed in the usual operation and 2-line (channel) coincidence (majority decision) system is employed in the degrade operation.

Figure 12:
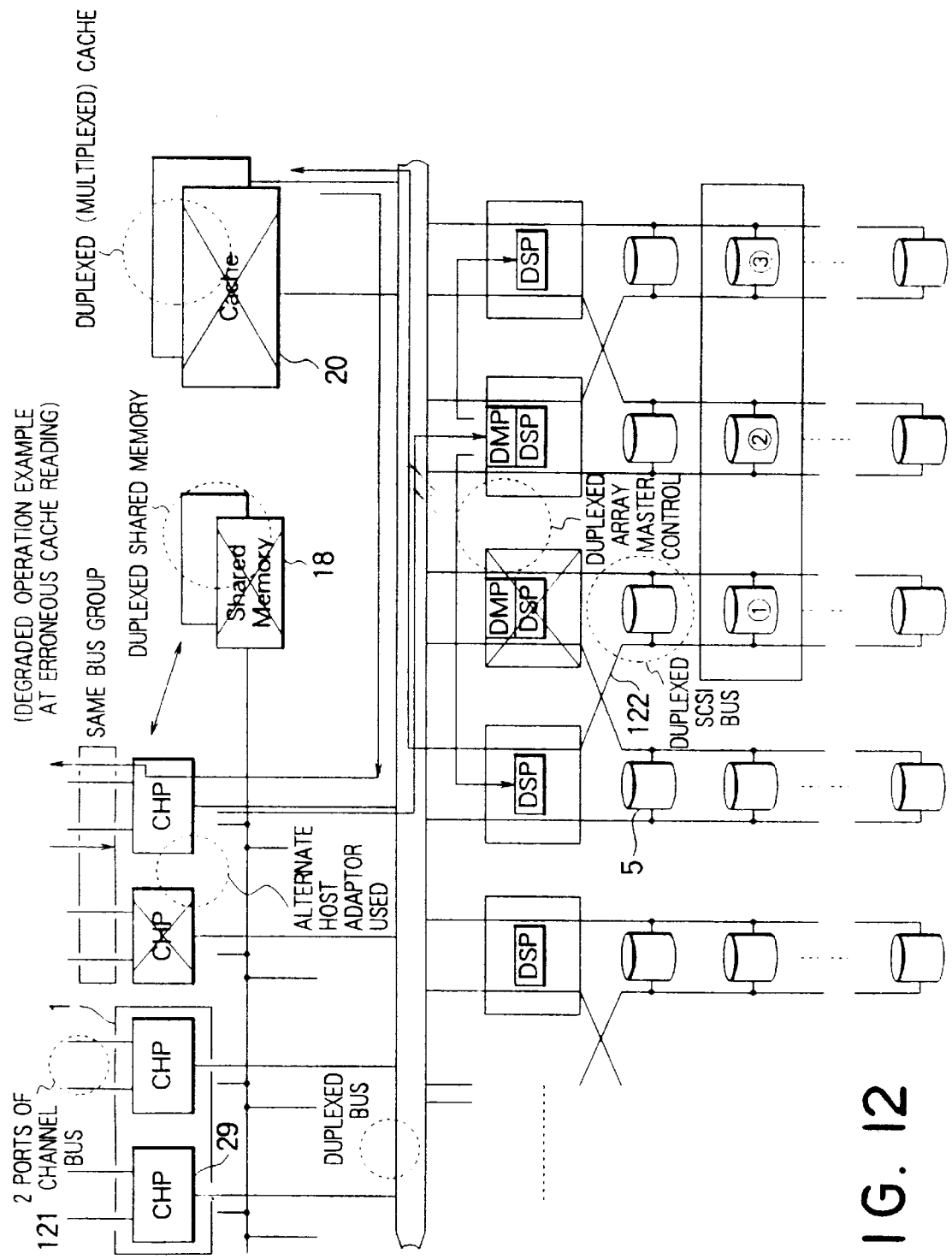
FIG. 12 is a diagram for explaining the duplex and degraded operation of each of parts in the system of the embodiment of the present invention.

FIG. 12 is a diagram for explaining the multiplexed structures of the respective parts and degrade operation.

Reference numeral 121 denotes a channel bus having 2 ports. The host adaptor 1 is provided with 2 of the channel adaptor modules 29 and 4 of the channel buses for the host device, so that, at the time of a failure occurrence, an alternate channel adaptor (CHP) and an alternate channel bus are used to enter into the degrade operation.

Reference numeral 122 denotes a SCSI bus forming an interface between the disk adaptor 2 and the array disk 5. The SCSI bus 122 is arranged as duplexed so that another disk adaptor 2 can access to a row of magnetic disks, whereby, when the bus becomes faulty, the alternate SCSI bus is used to enter into the degrade operation. The DMP 92 for controlling the array disk master specifies one of the DSPs 93 as the alternate DMP 92, such that, at the time of a failure occurrence, the alternate DMP 92 is used to control the array disk master.

The shared memory 18 and the cache memory 20 are also duplexed so that, when one of the duplexed shared memories becomes faulty, the other memory is used to enter into the degrade operation; while, when one of the duplexed cache memories becomes faulty, write pending data (data remaining on the cache memory) is destaged on the disk to perform the degraded operation with use of the other cache memory except for the faulty cache memory.

When one of the magnetic disks in the array disk 5 becomes faulty, reading/writing operation is carried out while the faulty magnetic disk is separated and a spare magnetic disk is instead replaced.

Figure 13:
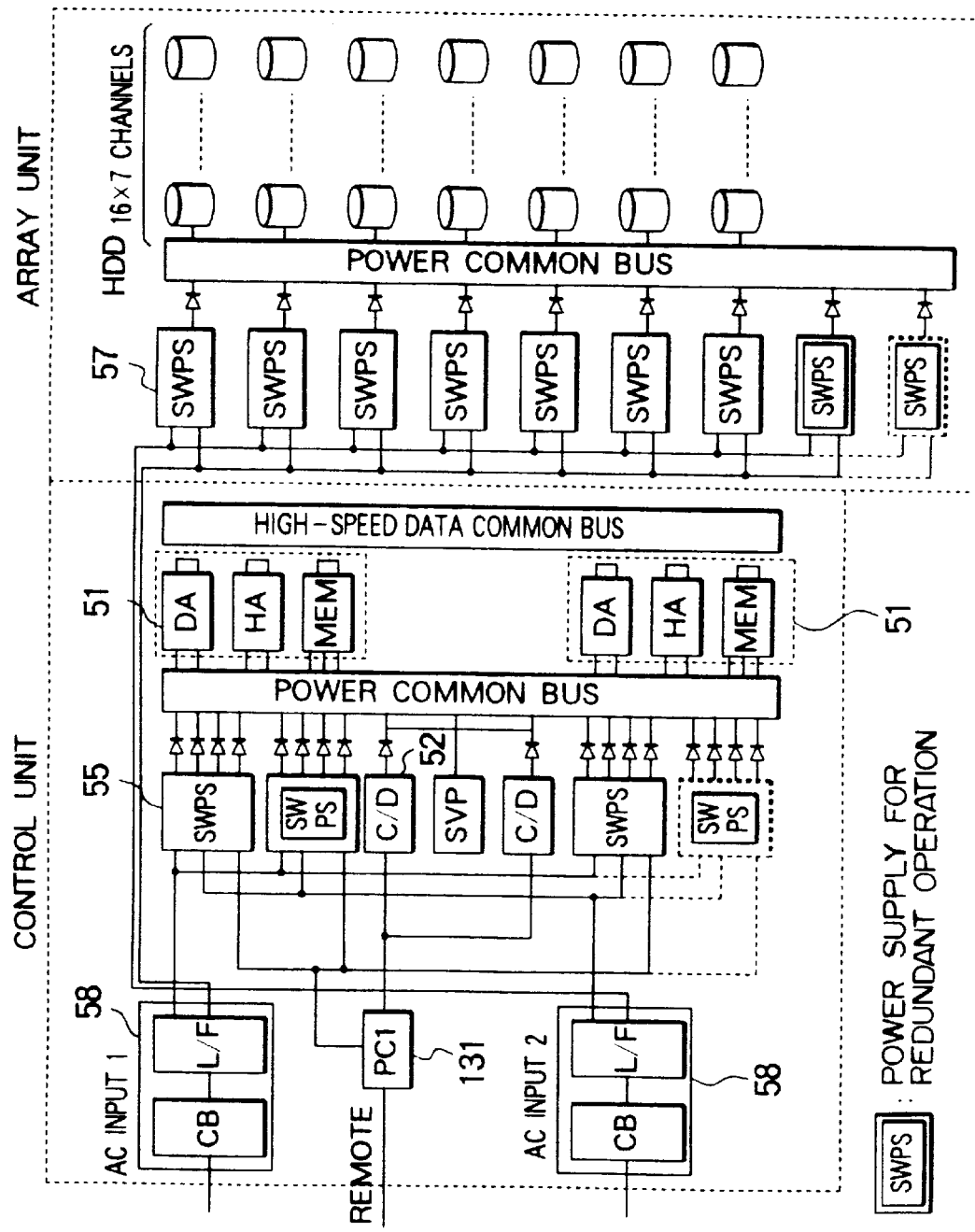
FIG. 13 is a diagram for explaining multiplex and degraded operationof a power supply system in the system of the embodiment of the present invention.

FIG. 13 is a diagram for explaining the multiplexed structure of a power supply system and degrade operation.

Since commercial power source controllers 58 are respectively duplexed on respectively independent AC input to supply power to switching power supplies 55 of the logical unit frame and to switching power supplies 57 of the array disk respectively, at the time of a failure occurrence, the other commercial power source controller 58 is used to enter into the degrade operation.

Reference numeral 131 denotes a power supply control circuit (which will be referred to as PCI, hereinafter) for performing remote control of power ON/OFF from the host device and for controlling the commercial power source controllers 58 and such power supply circuits as the both switching power supplies.

When the switching power supplies 55 of the logical unit frame are mounted by an additional number of 2 in addition to the number necessary for the redundant operation to supply power to logical unit frames 51 and batteries 52 through the power common bus, even if two of the switching power supplies 55 become faulty, the system can be operated.

Similarly, when the switching power supplies 57 of the array disk for supplying power to row units of a group of magnetic disks are mounted by an additional number of 2 in addition to the number necessary for the redundant operation to supply power through the power common bus, even if two of the switching power supplies 57 become faulty, the system can be operated. In addition, the system can be more inexpensively than when the both switching power supplies 55 and 57 are structured as duplexed.

In case of a power failure, power is supplied from the duplexed battery 52 via the power common bus to the cache memory as a volatile memory within the logical unit frame and to the PCI 131, so that, even when one of the batteries becomes faulty, the system can be operated.

Figures 14, 15:
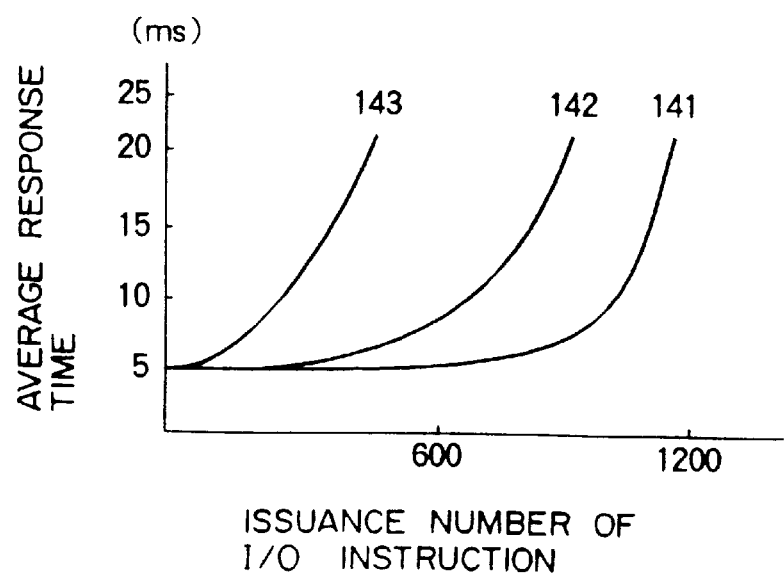
FIG. 14 show a structure of a single magnetic disk device used in an array disk.
FIG. 15 shows the storage capacity of the magnetic disk unit and the system performance of the array disk.

FIGS. 14 and 15 are a table and a graph showing comparative system performances when the different array disks are made up of different storage capacities of magnetic disk units.

More specifically, FIG. 14 shows the structures of array disks having the same capacity but using different types of magnetic disk units.

With regard to the array structure, 14 data disks and 2 parity disks form a set. In the case of an item number 141, 3 GB of magnetic disk unit (3.5-inch disk) is used and 5 sets of array structures are provided. In the case of an item number 142, 4 GB of magnetic disk unit (5-inch disk) is used and 4 sets of array configurations are provided. In the case of an item number 143, 8.4 GB of magnetic disk unit (6.4-inch disk) is used and 2 sets of array structures are provided.

FIG. 15 shows a relationship between I/O instruction issuance number per second and an average response time with respect to the magnetic disk units 141, 142 and 143. In order to improve the transaction performance of the array disk system, when a small-capacity (small-diametered) magnetic disk unit is used to increase the array configuration, the highest performance can be exhibited. For this reason, in accordance with the present invention, the 3.5-inch magnetic disk unit 141 is used to realize an array disk system. Accordingly, when comparison is made between a magnetic disk unit having the same storage capacity and made up of a single large-scale magnetic disk unit and a magnetic disk unit having the same storage capacity but made up of a plurality of small-size magnetic disk units arranged in an array, the latter array structure having the plurality of small-size magnetic disk units is more advantageous because its average access time can be shortened.

Shown in FIGS. 16 to 19 are model examples of the structure of the system implemented with use of such a scalable architecture as explained above.

Figure 16:
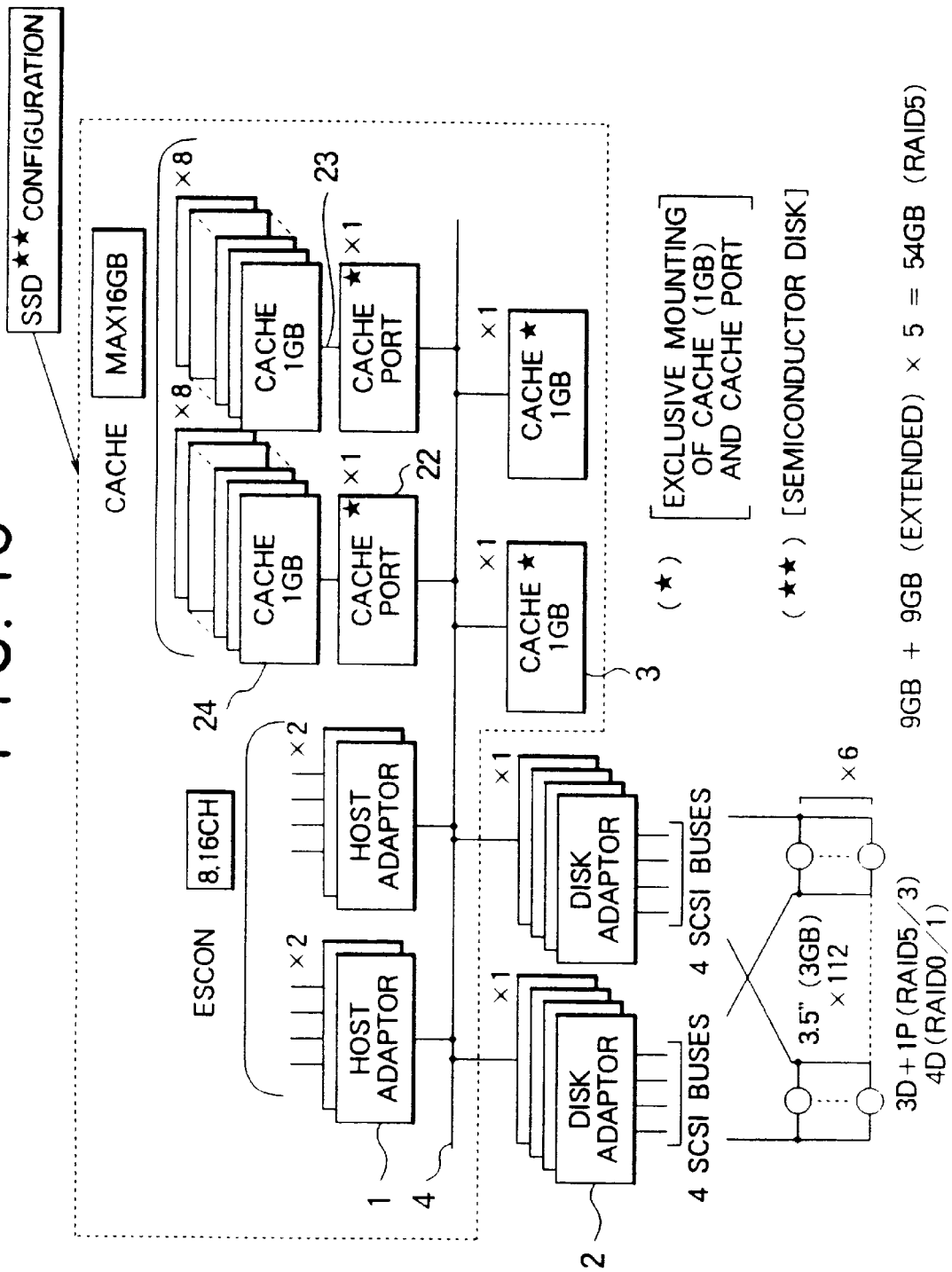
FIG. 16 is a structure of a small-size disk array provided with a high-performance, large-capacity cache memory.

More in detail, FIG. 16 shows an arrangement when the number of the disk adaptors 2 mounted on the common bus 4 is decreased and further the cache port packages 22 are mounted to be connected to the cache units 24 via the cable 23 to realize a small-size disk array having high-performance, large-capacity cache memories providing a high cache hit rate.

When the disk adaptors 2 are not mounted and the system is arranged only with the host adaptor 1 and cache memories (such an arrangement as enclosed by a broken line in FIG. 16), the magnetic disks as the storage medium are replaced by semiconductor memories and there is realized a high-performance semiconductor disk system allowing higher-speed data transmission.

Figure 17:
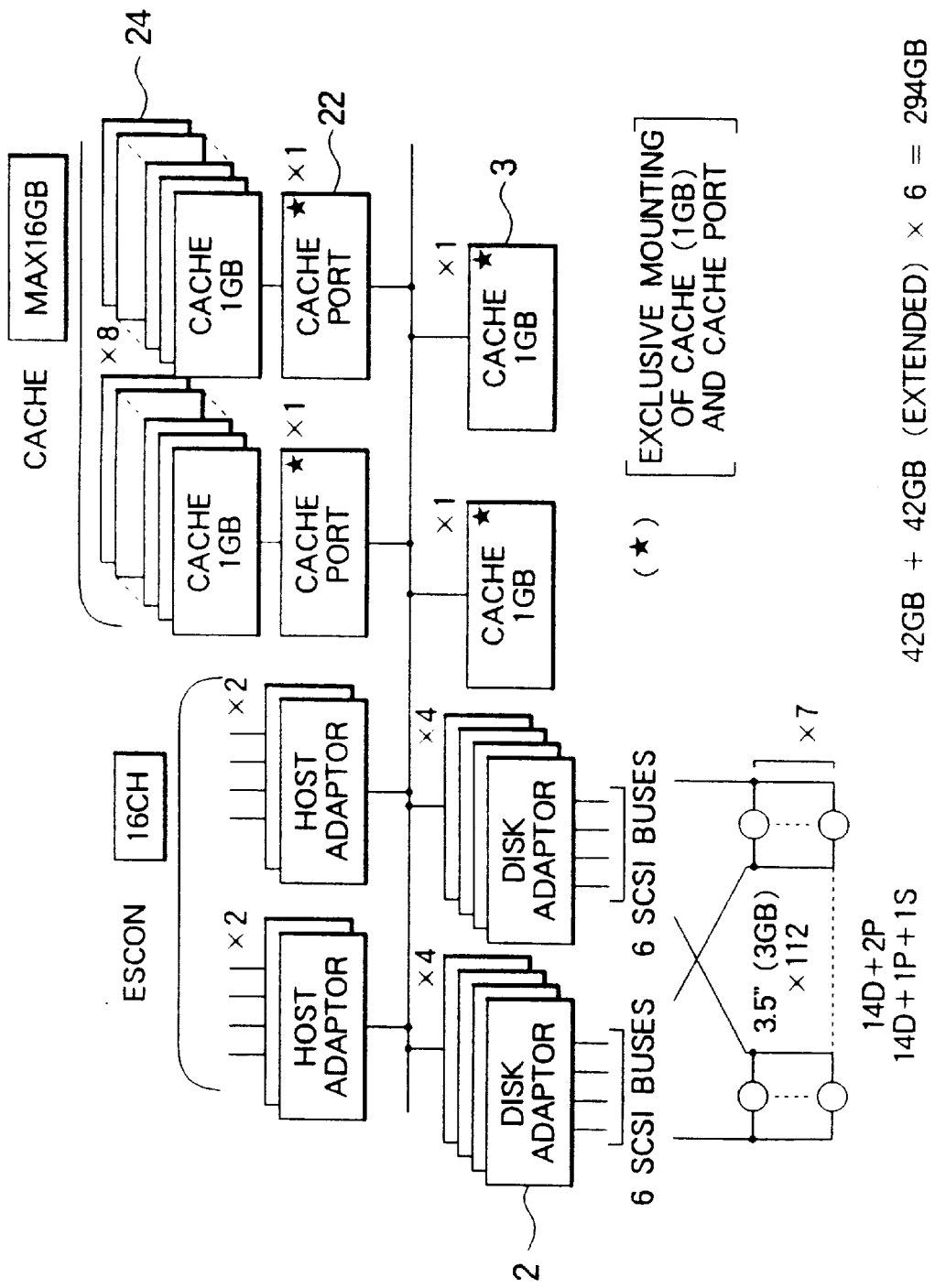
FIG. 17 is a structure of a large-size disk array provided with a high-performance, large-capacity cache memory.

FIG. 17 shows an arrangement when a maximum number of the disk adaptors 2 are provided, the cache packages 3 or the cache port packages 22 are provided to be connected to the cache units through the cable 23 to thereby realize a large-scale disk array system having high-performance, large-capacity cache memories.

Figure 18:
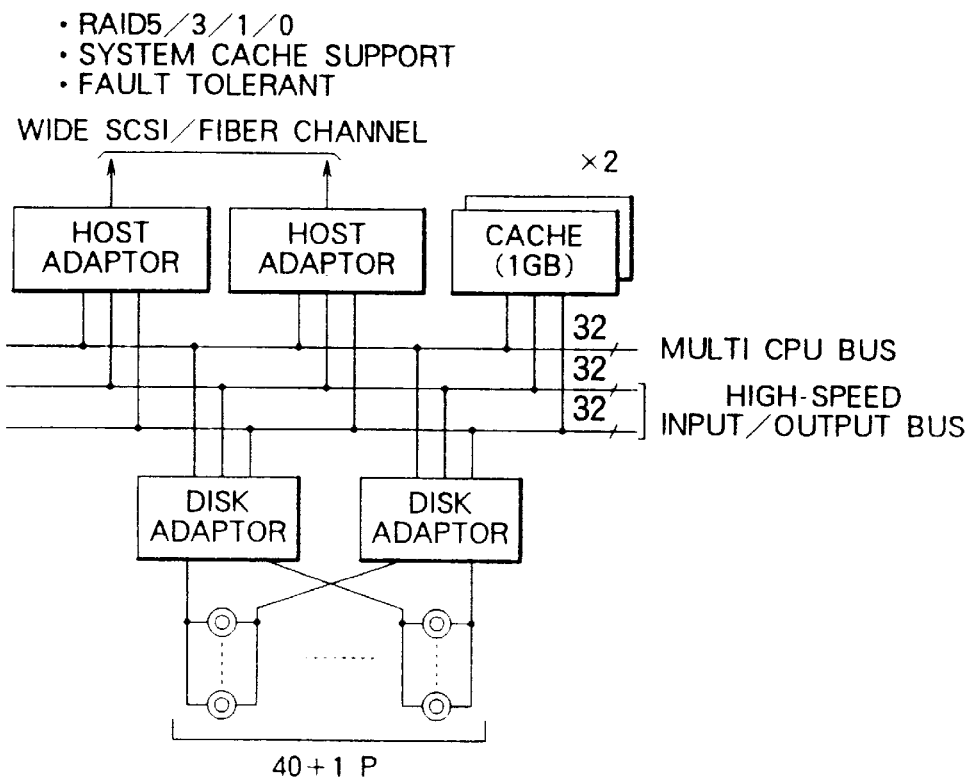
FIG. 18 is a structure of a high-performance fault tolerant server system.

FIG. 18 shows an arrangement when the host device interfaces of the host adaptors 1 are replaced by such interfaces as SCSI/fiber channels to reduce the mounting number of the disk adaptors 2 and further the F bus 26 is made up of 2 channels having a bit width corresponding to half of the bit width of the F bus to thereby realize a non-stop operation, high-performance fault tolerant (highly reliable) server system designed for an open market.

Figure 19:
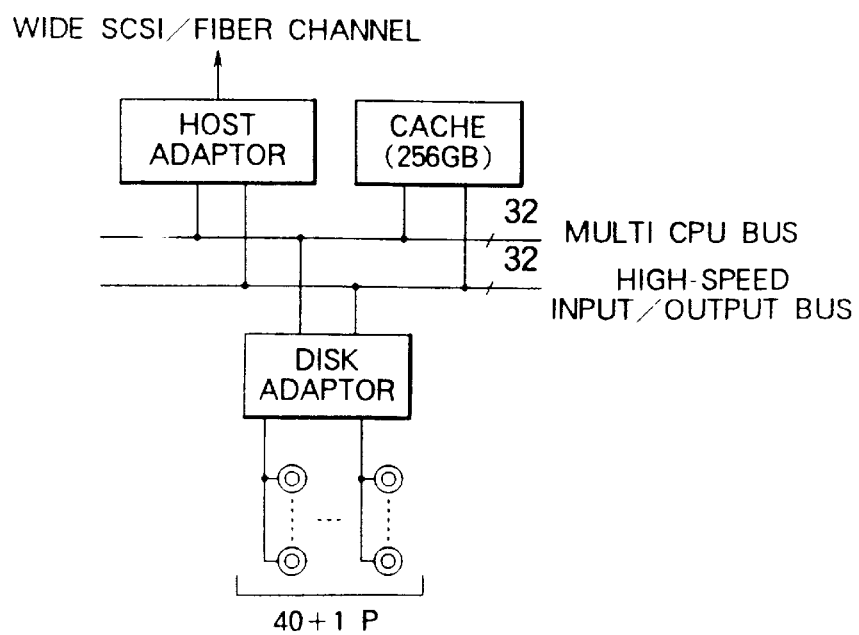
FIG. 19 is an arrangement of an inexpensive server system.
Figure 20:
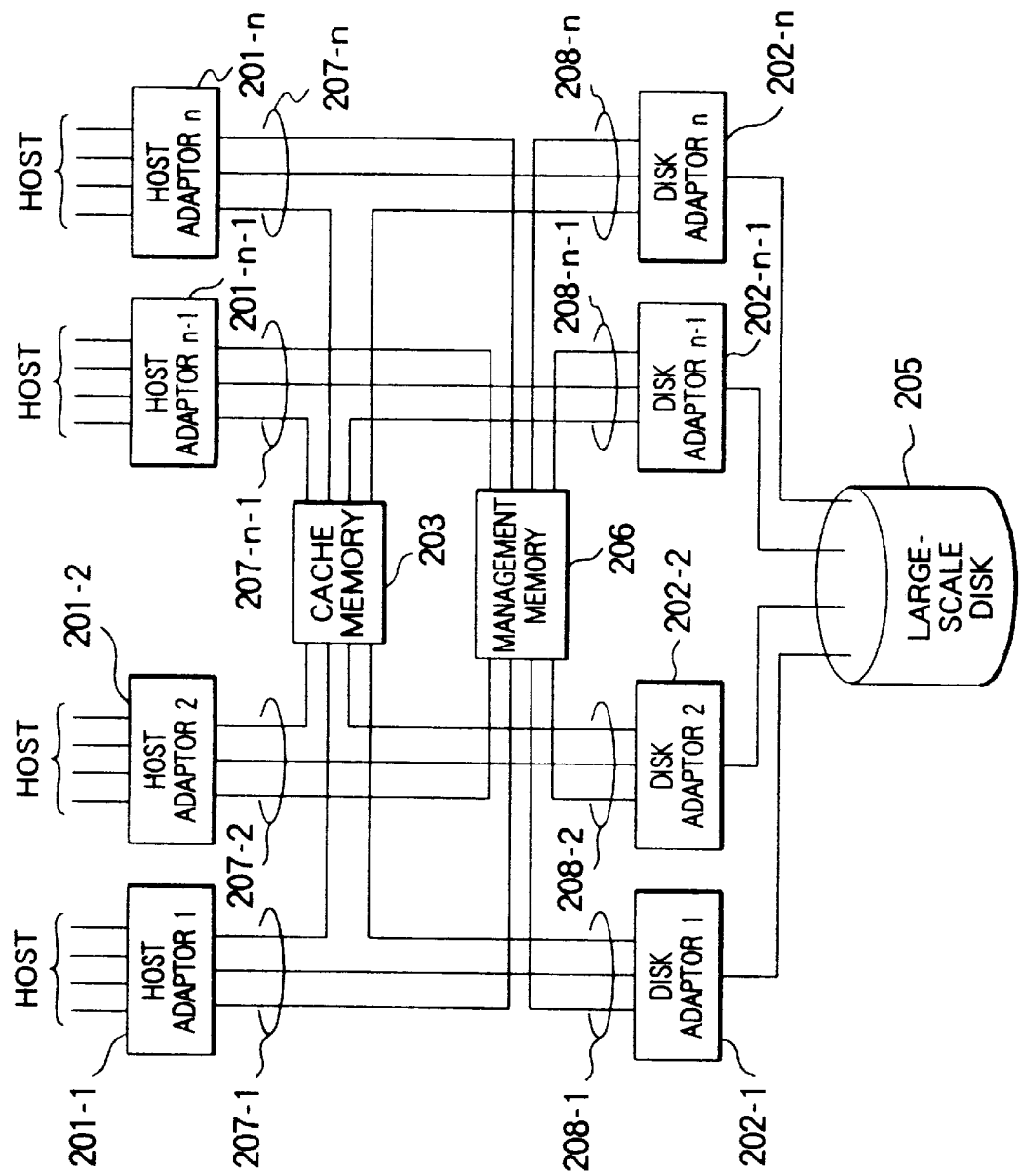
FIG. 20 is a schematic arrangement of a prior art storage system.

FIG. 19 shows a simplest arrangement of FIG. 18 when no consideration is paid to duplexed structure and hot replace to thereby realize a server system designed for an inexpensive open market. In the drawing, reference symbol 4D+1P means 4 data disks and a single parity disk.

In the foregoing embodiments, optical disk units can be connected to the common bus 4 through optical disk adaptors (optical disk connection logical modules), magnetic tape units can be connected thereto through magnetic tape controllers (magnetic disk connection logical modules), or semiconductor memories can be connected thereto through semiconductor memory connection logical modules. Further, workstations can be also connected to the common bus 4 through another type of host adaptors. In this way, storage medium adaptors to various types of memories can be connected to the common bus.

As has been explained in the foregoing, in accordance with the present invention, there is provided a storage system which comprises a plurality of logical units connected to a host device to form interfaces with the host device, a storage unit, a plurality of logical units connected to the memories to form interfaces with the storage unit, and cache memories (shared with the plurality of logical units connected to the host device and with the plurality of logical units connected to the storage unit) for temporarily storing therein data to be transferred between these devices and units, and wherein the plurality of logical units connected to the host device, the plurality of logical units connected to the storage unit, and the cache memories are interconnected by a common bus shared with these devices and units. As a result, there can be obtained a scalable system which realizes extension and modification of the plurality of logical units connected to the host device, the plurality of logical units connected to the memories, and the cache memories merely adding or modifying these on the common bus, and which realizes easy attainment of its upgrade based on the extended system provision. Further, since these logical units connected to the host device, logical units connected to the memories and cache memories are made in the form of modules to be detachably mounted to a back plane having the common bus disposed thereon, the necessary numbers of these units and memories can be easily increased advantageously.

Since the logical units connected to the host device, the logical units connected to the memories, and the cache memories are arranged in a duplexed form and the common bus is wired between these logical units and memory as divided into 2 channels, even when one of these units becomes faulty, the other unit can be used to perform degrade operation. In this case, since any of the logical units connected to the host device, the logical units connected to the memories, and the cache memories are provided with a connector allowing hot replace, the system advantageously allows its maintenance and inspection for exchange of a faulty part and also allows addition of parts for system extension while eliminating the need for halt of the system in operation.

Further, since the storage unit is made in an array form of a plurality of combined small memories, the memory array can advantageously shorten an access time when compared to that in the case of using the conventional single large-scale disk unit.

In addition, since the cache memory unit is made up of cache memory modules (cache memory packages) directly mounted to the common bus and the extending cache units and a necessary number of the extending cache units can be connected through the extending cache port packages directly mounted detachably to the common busses, the number of cache units can be easily increased or decreased advantageously.

As a result, there can be obtained a highly reliable storage system.

What is claimed is:

1. A storage system comprising;
    a plurality of first logical units coupled to at least one host device, said first logical units forming interfaces for the host device;
    a storage device which stores therein information transferred from the host device;
    a plurality of second logical units coupled to said storage device, said second logical units forming interfaces for the storage device;
    a plurality of buses coupled to said plurality of first logical units and said plurality of second logical units, said buses transferring data;
    at least one cache memory coupled to said plurality of buses, said at least one cache memory temporarily storing therein the data; and
    a memory, separate from said at least one cache memory, to be referred to by an external processor, said memory storing management information including degraded operation information in a management area, said degraded operation information indicates which of said buses is available for use due to failure in the other of said buses.

2. A storage system according to claim 1, wherein each of said plurality of first logical units and said plurality of second logical units detects a failure of said plurality of buses and selects one of said plurality of buses to be used in accordance with a result of the detection.

3. A storage system according to claim 1, wherein said storage device and said at least one cache memory are each configured to be coupled to said buses separate from said first logical units, and
    wherein said at least one cache is formed by a plurality of modules each being separately coupled to said buses.

4. A storage system according to claim 3, wherein user data is stored in said at least one cache memory separate from said management information stored in said memory.

5. A storage system according to claim 4, wherein said buses comprises:
    a first bus for transferring management information; and
    a second bus for transferring user data,
    wherein said management information is transferred by said first bus when said degraded operation information does not indicate a failed bus and is transferred by said second bus when said degraded operation information indicates a failed bus.

6. A storage system comprising:
    a storage device which stores therein information transferred from at least one host device;
    a plurality of buses which transfer data transferred from said at least one host device to said storage device;
    a plurality of first logical units each having one terminal coupled to said plurality of buses and other terminals coupled to said at least one host device, said first logical units forming interfaces for the host device;
    a plurality of second logical units each having one terminal coupled to said plurality of buses and other terminals coupled to said storage device, said second logical units forming interfaces for the storage device;
    at least one cache memory coupled to said plurality of buses, said at least one cache memory temporarily stores therein the data; and
    a memory, separate from said at least one cache memory, to be referred to by an external processor, said memory storing management information including degraded operation information in a management area, said degraded operation information indicates which of said buses is available for use due to a failure in the other of said buses.

7. A storage system according to claim 6, wherein each of said plurality of first logical units and said plurality of second logical units detects a failure of said plurality of buses and selects one of said plurality of buses to be used in accordance with a result of the detection.

8. A storage system according to claim 6, wherein said storage device and said at least one cache memory are each configured to be coupled to said buses separate from said first logical units, and
    wherein said at least one cache is formed by a plurality of modules each being separately coupled to said buses.

9. A storage system according to claim 8, wherein user data is stored in said at least one cache memory separate from said management information stored in said memory.

10. A storage system according to claim 9, wherein said buses comprises:
    a first bus for transferring management information; and
    a second bus for transferring user data,
    wherein said management information is transferred by said first bus when said degraded operation information does not indicate a failed bus and is transferred by said second bus when said degraded operation information indicates a failed bus.

11. A storage system comprising:
    a plurality of host adapters coupled to at least one host computer;
    a magnetic disc group which stores information transferred from said at least one host computer,
    a plurality of disc adapters coupled to said magnetic disc group, said disc adapters forming interfaces for said magnetic disc group;
    a plurality of buses coupled to said plurality of host adapters and said plurality of disc adapters, said buses transferring data between said host adapters and said disc adapters;
    a least one cache memory coupled to said plurality of buses, said at least one cache memory temporarily storing therein the data; and
    a memory, separate from said at least one cache memory, to be referred to by an external processor, said memory storing management information including degraded operation information in a management area, said degraded operation information indicates which of said buses is available for use due to a failure in the other of said buses.

12. A storage system according to claim 11, wherein each of said plurality of host adapters and said plurality of disk adapters detects a failure of said plurality of buses and selects one of said plurality of buses to be used in accordance with a result of the detection.

13. A storage system according to claim 11, wherein said storage device and said at least one cache memory are each configured to be coupled to said buses separate from said first logical units, and
    wherein said at least one cache is formed by a plurality of modules each being separately coupled to said buses.

14. A storage system according to claim 13, wherein user data is stored in said at least one cache memory separate from said management information stored in said memory.

15. A storage system according to claim 14, wherein said buses comprises:

a first bus for transferring management information; and a second bus for transferring user data, wherein said management information is transferred by said first bus when said degraded operation information does not indicate a failed bus and is transferred by said second bus when said degraded operation information indicates a failed bus.

16. A storage system comprising:

a plurality of first logical units coupled to at least one host device, said first logical units forming interfaces for the host device;

a storage device which stores therein information transferred from the host device;

a plurality of second logical units coupled to said storage device, said second logical units forming interfaces for the storage device;

a plurality of buses coupled to said plurality of first logical units and said plurality of second logical units, said buses transferring data;

at least one cache memory coupled to said plurality of buses, said at least one cache memory temporarily storing therein the data, wherein a failure of said plurality of buses is detected and one of said plurality of buses to be used is selected in accordance with a result of the detection; and a memory, separate from said at least one cache memory, to be referred to by an external processor, said memory storing management information including degraded operation information in a management area, said degraded operation information indicates which of said buses is available for use due to a failure in the other of said bus in accordance with a result of the detection.

17. A storage system according to claim 16, wherein said storage device and said at least one cache memory are each configured to be coupled to said buses separate from said first logical units, and wherein said at least one cache is formed by a plurality of modules each being separately coupled to said buses.

18. A storage system according to claim 17, wherein user data is stored in said at least one cache memory separate from said management information stored in said memory.

19. A storage system according to claim 18, wherein said buses comprises:

a first bus for transferring management information; and a second bus for transferring user data, wherein said management information is transferred by said first bus when said degraded operation information does not indicate a failed bus and is transferred by said second bus when said degraded operation information indicates a failed bus.

20. A storage system comprising:

a storage device which stores therein information transferred from at least one host device, a plurality of buses which transfers data transferred from said at least one host device to said storage device;

a plurality of first logical units each having one terminal coupled to said plurality of buses and other terminals coupled to said at least one host device, said first logical units forming interfaces for the host device;

a plurality of second logical units having one terminal coupled to said plurality of buses and other terminals coupled to said storage device, said second logical units forming interfaces for the storage device; and a least one cache memory coupled to said plurality of buses, said at least one cache memory temporarily storing therein the data, wherein a failure of said plurality of buses is detected and one of said plurality of buses to be used is selected in accordance with a result of the detection;, and a memory, separate from said at least one cache memory, to be referred to by an external processor, said memory storing management information including degraded operation information in a management area, said degraded operation information indicates which of said buses is available for use due to a failure in the other of said bus in accordance with a result of the detection.

21. A storage system according to claim 20, wherein said storage device and said at least one cache memory are each configured to be coupled to said buses separate from said first logical units, and wherein said at least one cache is formed by a plurality of modules each being separately coupled to said buses.

22. A storage system according to claim 21, wherein user data is stored in said at least one cache memory separate from said management information stored in said memory.

23. A storage system according to claim 22, wherein said buses comprises:

a first bus for transferring management information; and a second bus for transferring user data, wherein said management information is transferred by said first bus when said degraded operation information does not indicate a failed bus and is transferred by said second bus when said degraded operation information indicates a failed bus.

24. A storage system comprising:

a plurality of host adapters coupled to at least one host computer;

a magnetic disk group which stores information transferred from said at least one host computer;

a plurality of disk adapters coupled to said magnetic disk group, said disk adapters forming interfaces for said magnetic disk group;

a plurality of buses coupled to said plurality of host adapters and said plurality of disk adapters, said buses transferring data between said host adapters and said disk adapters; and a least one cache memory coupled to said plurality of buses, said at least one cache memory temporarily storing therein the data, wherein a failure of said plurality of buses is detected and one of said plurality of buses to be used is selected in accordance with a result of the detection; and a memory, separate from said at least one cache memory, to be referred to by an external processor, said memory storing management information including degraded; operation information in a management area, said degraded operation information indicates which of said buses is available for use due to a failure in the other of said bus in accordance with a result of the detection.

25. A storage system according to claim 24, wherein said storage device and said at least one cache memory are each configured to be coupled to said buses separate from said first logical units, and wherein said at least one cache is formed by a plurality of modules each being separately coupled to said buses.

26. A storage system according to claim 25, wherein user data is stored in said at least one cache memory separate from said management information stored in said memory.

27. A storage system according to claim 26, wherein said buses comprises:
- a first bus for transferring management information; and
- a second bus for transferring user data,
- wherein said management information is transferred by said first bus when said degraded operation information does not indicate a failed bus and is transferred by said second bus when said degraded operation information indicates a failed bus.

28. A storage system comprising;
- a plurality of first logical units coupled to at least one host device, said first logical units forming interfaces for the host device;
- a storage device which stores therein information transferred from the host device;
- a plurality of second logical units coupled to said storage device, said second logical units forming interfaces for the storage device;
- a plurality of buses coupled to said plurality of first logical units and said plurality of second logical units, said buses transferring data;
- at least one cache memory coupled to said plurality of buses, said at least one cache memory temporarily storing therein the data;
- wherein a failure of said plurality of buses is detected and one of said plurality of buses to be used is selected in accordance with a result of the detection; and
- a memory, separate from said at least one cache memory, to be referred to by an external processor, said memory storing management information including degraded operation information in a management area, said degraded operation information indicates which bus is available for use due to failure in accordance with a result of the detection.

29. A storage system according to claim 28, wherein said storage device and said at least one cache memory are each configured to be coupled to said buses separate from said first logical units, and
- wherein said at least one cache is formed by a plurality of modules each being separately coupled to said buses.

30. A storage system according to claim 29, wherein user data is stored in said at least one cache memory separate from said management information stored in said memory.

31. A storage system according to claim 30, wherein said buses comprises:
- a first bus for transferring management information; and
- a second bus for transferring user data,
- wherein said management information is transferred by said first bus when said degraded operation information does not indicate a failed bus and is transferred by said second bus when said degraded operation information indicates a failed bus.

\* \* \* \* \*